US012598746B2

(12) United States Patent
    Arai

(10) Patent No.: US 12,598,746 B2
(45) Date of Patent: Apr. 7, 2026

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventor: Shinya Arai, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 528 days.

(21) Appl. No.: 17/683,605

(22) Filed: Mar. 1, 2022

(65) Prior Publication Data

US 2022/0406811 A1      Dec. 22, 2022

(30) Foreign Application Priority Data

Jun. 21, 2021    (JP) ................................. 2021-102403

(51) Int. Cl.
    *H10B 43/27*        (2023.01)
    *H01L 23/00*        (2006.01)
            (Continued)

(52) U.S. Cl.
    CPC ............. *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H01L 2224/08145* (2013.01);
            (Continued)

(58) Field of Classification Search
    None
    See application file for complete search history.

(56) References Cited

U.S. PATENT DOCUMENTS 9,997,532 B2 *    6/2018    Ko ......................... H10B 43/27
10,043,808 B1    8/2018    Tezuka et al.
            (Continued)

FOREIGN PATENT DOCUMENTS

CN        109037223 A    12/2018
CN        110310957 A    10/2019
            (Continued)

*Primary Examiner* — Steven B Gauthier
*Assistant Examiner* — E. Rhett Cheek
(74) *Attorney, Agent, or Firm* — Foley & Lardner LLP

(57)        ABSTRACT

A semiconductor storage device includes a stack, a columnar body, and a second conductive layer. The stack includes a plurality of first conductive layers and a plurality of insulating layers. In the stack, the plurality of first conductive layers and the plurality of insulating layers are alternately stacked one by one in a first direction. The second conductive layer is connected to the columnar body. The columnar body includes an insulating core, a memory film, and a semiconductor channel. The memory film is provided between the plurality of first conductive layers and the insulating core. The semiconductor channel is provided between the insulating core and the memory film. An upper surface of the insulating core is located lower than an upper end of the columnar body. The second conductive layer has a main body portion and a protrusion. The protrusion protrudes from the main body portion toward the upper surface of the insulating core, and extends in the first direction within the columnar body. The protrusion is in contact with the semiconductor channel on a bottom surface or a side surface of the protrusion.

17 Claims, 19 Drawing Sheets

(51) Int. Cl.
| | |
|---|---|
| *H01L 25/00* | (2006.01) |
| *H01L 25/065* | (2023.01) |
| *H01L 25/18* | (2023.01) |
| *H10B 41/27* | (2023.01) |

(52) U.S. Cl.
CPC .............. *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | | |
|---|---|---|---|
| 12,213,315 B2* | 1/2025 | Lee | .......................... H10B 43/27 |
| 2016/0005759 A1* | 1/2016 | Kim | ........................ H10B 41/50 |
| | | | 257/314 |
| 2016/0148948 A1* | 5/2016 | Kim | ...................... H01L 23/528 |
| | | | 438/269 |
| 2016/0172370 A1 | 6/2016 | Makala et al. | |
| 2018/0130814 A1* | 5/2018 | Lee | .......................... H10B 43/27 |
| 2018/0138194 A1 | 5/2018 | Shigemura et al. | |
| 2018/0261623 A1* | 9/2018 | Higashi | .................. H10B 43/50 |
| 2018/0358370 A1 | 12/2018 | Hwang et al. | |
| 2018/0374864 A1* | 12/2018 | Fukuzumi | ............. H01L 21/185 |
| 2018/0374866 A1 | 12/2018 | Makala et al. | |
| 2019/0296031 A1 | 9/2019 | Murata et al. | |
| 2019/0296041 A1 | 9/2019 | Yamasaka et al. | |
| 2020/0091166 A1* | 3/2020 | Zhang | ..................... H10B 41/35 |
| 2020/0091170 A1* | 3/2020 | Baek | ................... H01L 29/1037 |
| 2020/0212059 A1* | 7/2020 | Nishikawa | ........... H10D 64/037 |
| 2020/0235118 A1 | 7/2020 | Ohnuki | |
| 2020/0273880 A1 | 8/2020 | Sotome et al. | |
| 2020/0286876 A1 | 9/2020 | Nakaki | |
| 2020/0365614 A1* | 11/2020 | Kim | ....................... H10B 43/27 |
| 2021/0035987 A1* | 2/2021 | Lee | ................... H01L 29/40117 |
| 2021/0057425 A1 | 2/2021 | Han et al. | |
| 2021/0082947 A1 | 3/2021 | Kobayashi et al. | |
| 2021/0082951 A1 | 3/2021 | Toyonaga | |
| 2022/0344244 A1* | 10/2022 | Ryu | ....................... H10B 43/27 |
| 2022/0406811 A1 | 12/2022 | Arai | |
| 2024/0379647 A1* | 11/2024 | Jung | ..................... H10B 43/40 |

FOREIGN PATENT DOCUMENTS

| | | |
|---|---|---|
| CN | 217641334 U | 10/2022 |
| JP | 2020-145233 A | 9/2020 |
| JP | 2022-041054 A | 3/2022 |
| TW | 201941403 A | 10/2019 |
| TW | 202029470 A | 8/2020 |
| TW | 202032769 A | 9/2020 |
| TW | 202109764 A | 3/2021 |
| TW | 202114167 A | 4/2021 |
| TW | 202114182 A | 4/2021 |

* cited by examiner

MH 71
21
71
21
71
21

70

72

60

CLb 21
31
21
31
72
60

Y ⊗ → X
↓ Z 30
80
41

CLc

Z
↑
Y ⊗ → X

MH 71
21
71
21
71
21
70
72
60

CLe 31
21
31
21
31
21
70
72
60

SEMICONDUCTOR STORAGE DEVICE AND METHOD OF MANUFACTURING SEMICONDUCTOR STORAGE DEVICE

CROSS-REFERENCE TO RELATED APPLICATION(S)

This application is based upon and claims the benefit of priority from Japanese Patent Application No. 2021-102403, filed Jun. 21, 2021, the entire contents of which are incorporated herein by reference.

FIELD

Embodiments described herein relate generally to a semiconductor storage device and a method of manufacturing the semiconductor storage device.

BACKGROUND

A NAND-type flash memory in which memory cells are stacked in a three-dimensional manner has been known.

DETAILED DESCRIPTION

Figure 1:
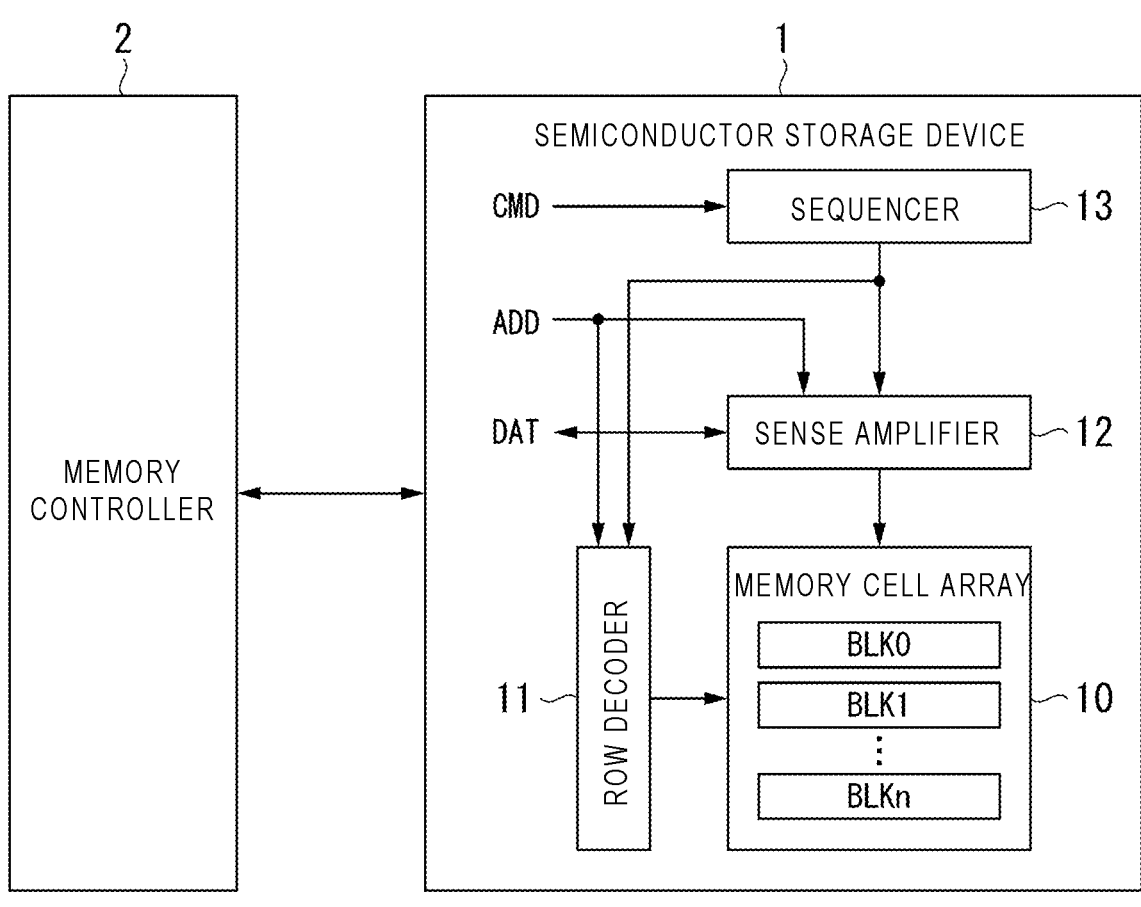
FIG. 1 is a block diagram illustrating a semiconductor storage device and a memory controller according to a first embodiment.

At least one embodiment provides a semiconductor storage device and a method of manufacturing the semiconductor storage device, which may prevent deterioration of cell current.

In general, according to at least one embodiment, a semiconductor storage device includes a stack, a columnar body, and a second conductive layer. The stack includes a plurality of first conductive layers and a plurality of insulating layers. In the stack, the plurality of first conductive layers and the plurality of insulating layers are alternately stacked one by one in a first direction. The columnar body extends in the first direction in the stack. The second conductive layer is connected to the columnar body. The columnar body includes an insulating core, a memory film, and a semiconductor channel. The memory film is provided between the plurality of first conductive layers and the insulating core. The semiconductor channel is provided between the insulating core and the memory film. An upper surface of the insulating core is located lower than an upper end of the columnar body. The second conductive layer has a main body portion and a protrusion. The protrusion protrudes from the main body portion toward the upper surface of the insulating core, and extends in the first direction within the columnar body. The protrusion is in contact with the semiconductor channel on a bottom surface or a side surface of the protrusion.

Hereinafter, a semiconductor storage device and a method of manufacturing the semiconductor storage device according to embodiments will be described with reference to the accompanying drawings. In the following description, the same reference numerals will be given to components having the same or similar functions. Then, a duplicated description of these components may be omitted. The drawings are schematic or conceptual, and a relationship between the thickness and width of each part and the ratio of sizes between the parts may not be said to be necessarily the same as the actual ones. In this application, the term "connection" is not limited to a case of being physically connected, but also includes a case of being electrically connected. In this application, the phrases "parallel", "orthogonal", and "the same" also include a case of "substantially parallel", "substantially orthogonal", and "substantially the same", respectively.

First, the X direction, Y direction, and Z direction will be defined. The X direction and the Y direction are directions substantially parallel to the surface of a substrate 50 (to be described later). The X direction and the Y direction are orthogonal to each other. The Z direction is orthogonal to the X direction and the Y direction, and is a direction away from the substrate 50. However, these expressions are used for convenience only and do not specify the direction of gravity. In this embodiment, the Z direction is an example of the "first direction".

In the drawings referenced below, for example, the X direction corresponds to the direction in which a word line WL extends, the Y direction corresponds to the direction in which a bit line BL extends, and the Z direction corresponds to the direction perpendicular to the surface of the substrate 50 used for the formation of a semiconductor storage device 1. In a plan view, hatching is appropriately added to certain components in order to make the drawing easier to see. The hatching added to the plan view is not necessarily related to the material or characteristics of the components to which the hatching is added. In each of a plan view and cross-sectional views, illustration of certain components such as wirings, contacts, and interlayer insulating films is appropriately omitted in order to make the drawings easier to see.

First Embodiment

FIG. 1 is a block diagram illustrating the semiconductor storage device 1 and a memory controller 2. The semiconductor storage device 1 is a non-volatile semiconductor storage device, and is, for example, a NAND-type flash memory. The semiconductor storage device 1 includes, for example, a memory cell array 10, a row decoder 11, a sense amplifier 12, and a sequencer 13.

The memory cell array 10 includes a plurality of blocks BLK0 to BLKn (n being an integer of 1 or more). Each block BLK is a set of non-volatile memory cell transistors MT (see, for example, FIG. 2). The memory cell array 10 is provided with a plurality of bit lines and a plurality of word lines. Each memory cell transistor MT is connected to one bit line and one word line. A detailed configuration of the memory cell array 10 will be described later.

The row decoder 11 selects one block BLK based on address information ADD received from the external memory controller 2. The row decoder 11 applies a desired voltage to each of the plurality of word lines, thereby controlling a data write operation and a data read operation with respect to the memory cell array 10.

The sense amplifier 12 applies a desired voltage to each bit line according to write data DAT received from the memory controller 2. The sense amplifier 12 determines data stored in the memory cell transistor MT based on the voltage of the bit line, and transmits the determined read data DAT to the memory controller 2.

The sequencer 13 controls an entire operation of the semiconductor storage device 1 based on a command CMD received from the memory controller 2.

The semiconductor storage device 1 and the memory controller 2 described above may constitute one semiconductor device by such a combination. Examples of the semiconductor device may include a memory card such as an SD (registered trademark) card and a solid state drive (SSD).

Next, an electrical configuration of the memory cell array 10 will be described.

Figure 2:
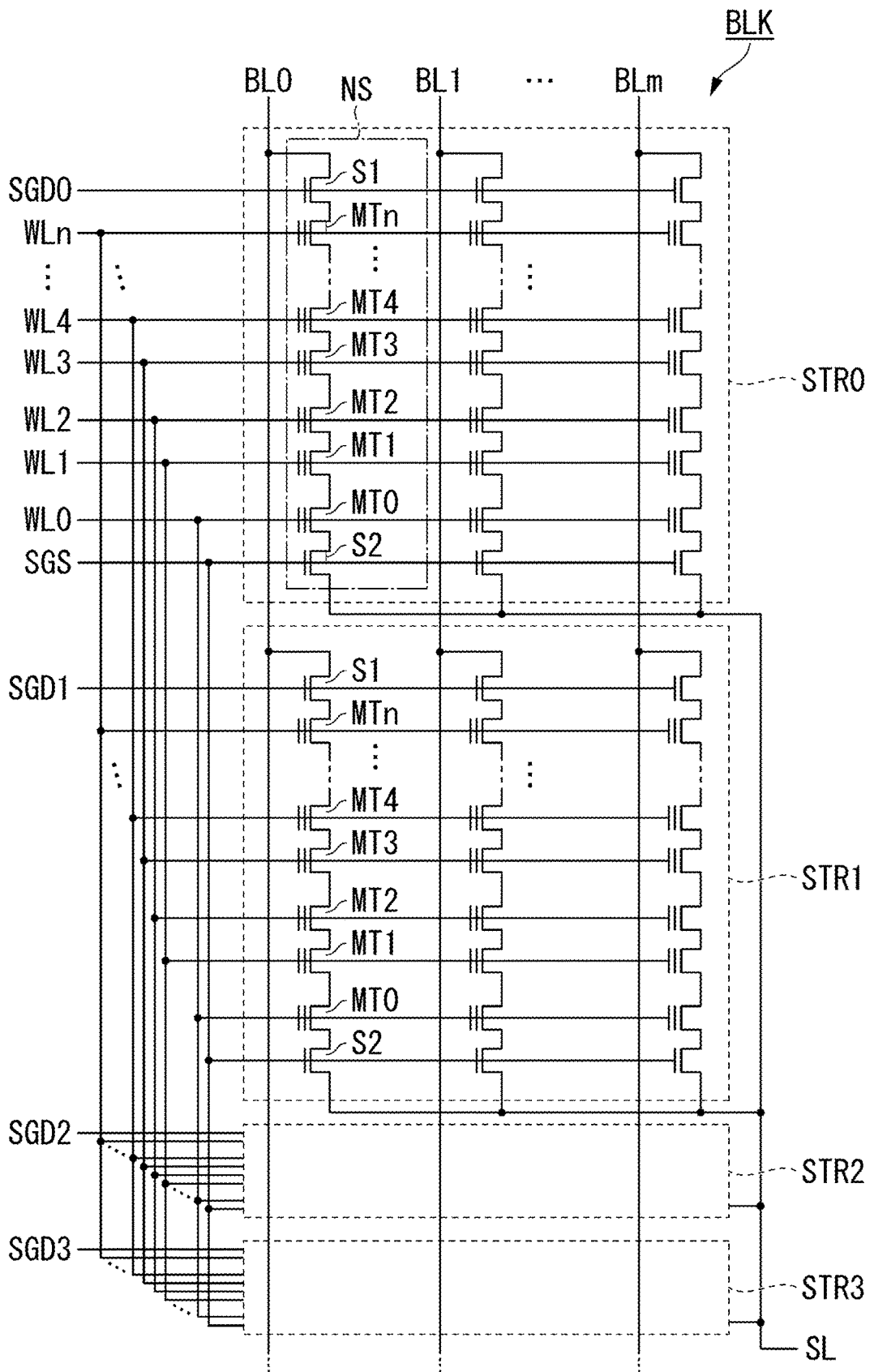
FIG. 2 is a diagram illustrating an equivalent circuit of a part of a memory cell array of the semiconductor storage device according to the first embodiment.

FIG. 2 is a diagram illustrating an equivalent circuit of a part of the memory cell array 10. FIG. 2 illustrates one extracted block BLK provided in the memory cell array 10. The block BLK includes a plurality of (for example, four) strings STR0 to STR3.

Each of the strings STR0 to STR3 is an aggregate of a plurality of NAND strings NS. One end of each NAND string NS is connected to any one of bit lines BL0 to BLm (m being an integer of 1 or more). The other end of the NAND string NS is connected to a source line SL. Each NAND string NS includes a plurality of memory cell transistors MT0 to MTn (n being an integer of 1 or more), a first select transistor S1, and a second select transistor S2.

The plurality of memory cell transistors MT0 to MTn are electrically connected to each other in series. The memory cell transistor MT includes a control gate and a memory film (for example, a charge storage film), and stores data in a non-volatile manner. The memory cell transistor MT changes the state of the memory film according to the voltage applied to the control gate (for example, stores charges in the charge storage film). The control gate of the memory cell transistor MT is connected to any one of the corresponding word lines WL0 to WLn. The memory cell transistor MT is electrically connected to the row decoder 11 via the word line WL.

The first select transistor S1 in each NAND string NS is connected between the plurality of memory cell transistors MT0 to MTn and any one of the bit lines BL0 to BLm. A drain of the first select transistor S1 is connected to any one of the bit lines BL0 to BLm. A source of the first select transistor S1 is connected to the memory cell transistor MTn. A control gate of the first select transistor S1 in each NAND string NS is connected to any one of select gate lines SGD0 to SGD3. The first select transistor S1 is electrically connected to the row decoder 11 via the select gate line SGD. The first select transistor S1 interconnects the NAND string NS and the bit line BL when a predetermined voltage is applied to any one of the select gate lines SGD0 to SGD3.

The second select transistor S2 in each NAND string NS is connected between the plurality of memory cell transistors MT0 to MTn and the source line SL. A drain of the second select transistor S2 is connected to the memory cell transistor MT0. A source of the second select transistor S2 is connected to the source line SL. A control gate of the second select transistor S2 is connected to a select gate line SGS. The second select transistor S2 is electrically connected to the row decoder 11 via the select gate line SGS. The second select transistor S2 interconnects the NAND string NS and the source line SL when a predetermined voltage is applied to the select gate line SGS.

In addition, the memory cell array 10 may have a circuit configuration other than that described above. For example, the number of respective strings STR provided in each block BLK, the number of memory cell transistors MT provided in each NAND string NS, and the number of select transistors STD and STS may be changed. Further, the NAND string NS may include one or more dummy transistors.

Figure 3:
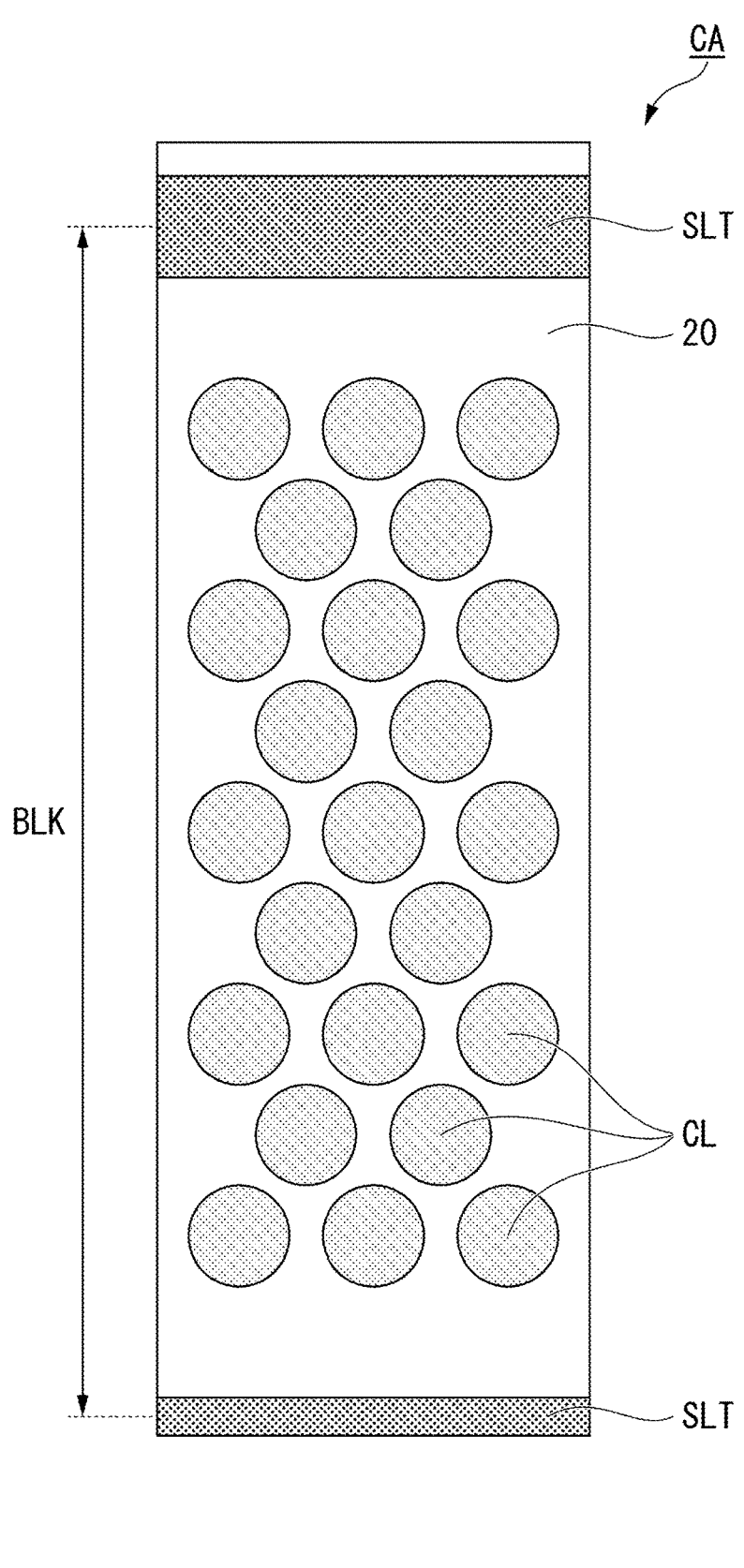
FIG. 3 is a plan view illustrating a part of the semiconductor storage device according to the first embodiment.
Figure 4:
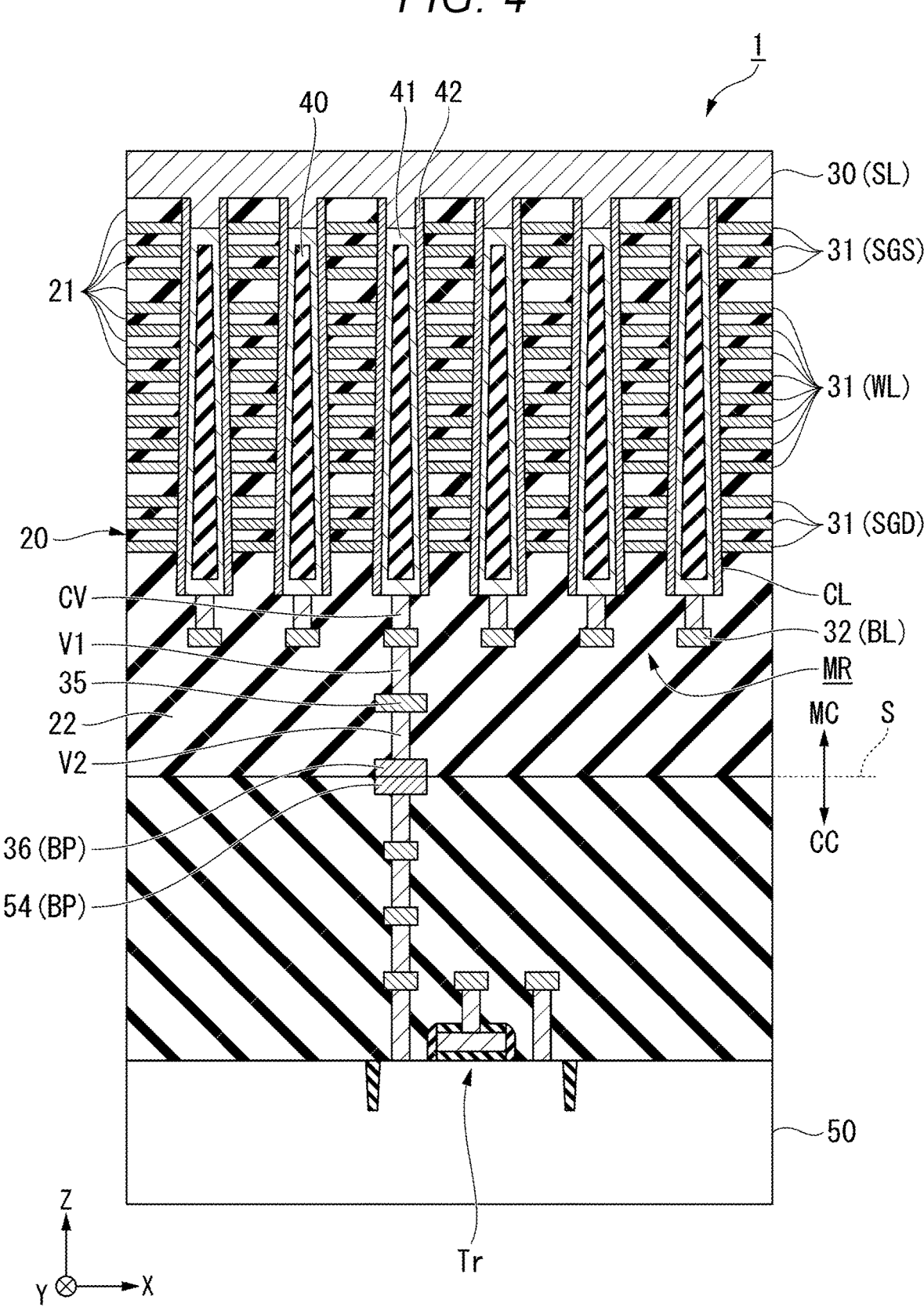
FIG. 4 is a cross-sectional view illustrating a part of the semiconductor storage device according to the first embodiment.

Next, an example of the structure of the semiconductor storage device 1 will be described. FIG. 3 is a plan view illustrating a part of the semiconductor storage device 1 according to a first embodiment. FIG. 4 is a cross-sectional view illustrating a part of the semiconductor storage device 1 according to the first embodiment.

As illustrated in FIG. 4, the semiconductor storage device 1 is a three-dimensional memory in which a memory chip MC and a circuit chip CC are bonded. The memory chip MC is an example of a "first chip". The circuit chip CC is an example of a "second chip". The memory chip MC and the circuit chip CC are bonded with an interface S therebetween. That is, a lower surface of the memory chip MC and an upper surface of the circuit chip CC are bonded.

The region of the memory chip MC may be divided into, for example, a memory region MR, a draw region HR (not illustrated), and a pad region PR (not illustrated). The memory region MR is a region in which the plurality of memory cell transistors MT (see, for example, FIG. 2) are arranged in a three-dimensional manner to store data. The memory region MR occupies most of the memory chip MC and is used for data storage.

As illustrated in FIG. 3, the semiconductor storage device 1 has a stack 20, a plurality of slits SLT, a plurality of columnar bodies CL, and the plurality of bit lines BL (see, for example, FIG. 4) in the memory region MR. Each of the plurality of columnar bodies CL in the memory region MR corresponds to the above-mentioned NAND string NS (see, for example, FIG. 2).

The memory region MR is divided into the plurality of blocks BLK by the slits SLT. That is, the region separated by the slits SLT corresponds to one block BLK. The columnar bodies CL are dotted in the memory region MR in a plan view from the Z direction. The plurality of columnar bodies CL are arranged, for example, in a zigzag shape in the Y direction in a plan view from the Z direction. The columnar body CL has, for example, a circular shape or an elliptical shape in a plan view from the Z direction.

The planar layout in the memory region MR of the semiconductor storage device 1 is not limited to the layout illustrated in FIG. 3, and may be any other layout. For example, the number and arrangement of the columnar bodies CL between the slits SLT adjacent to each other may be appropriately changed.

As illustrated in FIG. 4, the memory chip MC of the semiconductor storage device 1 includes a structure corresponding to the memory cell array 10. That is, the semiconductor storage device 1 has the stack 20, the columnar bodies CL, and a second conductive layer 30 in the memory region MR of the memory chip MC. A first pad 36 and contacts V1 and V2 for electrical connection with the circuit chip CC are provided below the stack 20, and the stack 20 is bonded to the circuit chip CC (to be described later) by the first pad 36.

The second conductive layer 30 is provided above the stack 20 and is connected to the plurality of columnar bodies CL. The second conductive layer 30 is formed, for example, in a plate shape spreading along the X direction and the Y direction, and functions as the source line SL. As for the material of the second conductive layer 30, for example, a metal material is used. For example, one or two or more selected from the group consisting of titanium, a titanium nitride, nickel, a nickel silicide (NiSi), and P-doped silicon (Si) may be used. In addition, silicide may be used as the material of the second conductive layer 30. In this case, for example, a nickel silicide or titanium silicide is used as the second conductive layer 30. Further, a conductor layer (not illustrated) may be further provided above the second conductive layer 30. As for the conductor layer in this case, for example, aluminum, titanium, titanium nitride, tungsten, titanium nitride, or aluminum nitride may be used.

The stack 20 has a plurality of insulating layers 21 and a plurality of first conductive layers 31. The plurality of insulating layers 21 and the plurality of first conductive layers 31 are alternately stacked one by one in the Z direction.

The plurality of insulating layers 21 spread in the X direction and the Y direction, respectively. The insulating layers 21 contain, for example, a silicon oxide. The insulating layers 21 are located between the first conductive layer 31 and the second conductive layer 30 and between the first conductive layers 31 adjacent to each other in the Z direction. The insulating layer 21 insulates between two first conductive layers 31 adjacent to each other in the Z direction. The number of insulating layers 21 is determined by the number of first conductive layers 31.

The plurality of first conductive layers 31 spread in the X direction and the Y direction, respectively. That is, each of the first conductive layers 31 is formed in a plate shape spreading along the X direction and the Y direction. The first conductive layer 31 is, for example, tungsten or polysilicon doped with impurities. The number of layers of the first conductive layers 31 may be selected freely.

The first conductive layer 31 may be functionally divided into, for example, three. The first conductive layer 31 functions as any one of the select gate line SGS on the source side, the word line WL, and the select gate line SGD on the drain side.

Among the first conductive layers 31, at least one first conductive layer 31 from the top of the stack 20 functions as the select gate line SGS on the source side. The first conductive layer 31 functioning as the select gate line SGS may be a single layer or a plurality of layers. That is, the select gate line SGS may be configured with a single first conductive layer 31, or may be configured with a plurality of first conductive layers 31. Further, when the select gate line SGS is configured with a plurality of layers, each of the first conductive layers 31 may be configured with different conductors.

Among the first conductive layers 31, at least one first conductive layer 31 from the bottom of the stack 20 functions as the select gate line SGD on the drain side. The first conductive layer 31 functioning as the select gate line SGD may be a single layer or a plurality of layers. That is, the select gate line SGD on the drain side may be configured with a single first conductive layer 31, or may be configured with a plurality of first conductive layers 31. Further, when the select gate line SGD on the drain side is configured with a plurality of layers, each of the first conductive layers 31 may be configured with different conductors.

Among the first conductive layers 31, the first conductive layer 31 other than the select gate lines SGS and SGD functions as the word line WL. The first conductive layer 31 functioning as the word line WL surrounds, for example, the outer periphery of the columnar body CL.

An insulating layer 22 is provided below the lowermost first conductive layer 31. A conductive layer 32 is provided within the insulating layer 22. The conductive layer 32 is formed, for example, in a line shape extending in the Y direction and functions as the bit line BL. That is, a plurality of conductive layers 32 are arranged in the X direction in a region (not illustrated).

The plurality of columnar bodies CL are provided in the stack 20. The plurality of columnar bodies CL extend in the Z direction, respectively. For example, the plurality of columnar bodies CL penetrate the stack 20 in the Z direction, respectively. Each columnar body CL includes, for example, an insulating core 40, a semiconductor channel 41, and a memory stacked film 42.

A lower portion of the columnar body CL is in contact with the insulating layer 22. An upper portion of the columnar body CL is in contact with the second conductive layer 30. A detailed structure of the upper portion of the columnar body CL will be described later.

A columnar contact CV is provided below each columnar body CL. In the illustrated region, the contact CV corresponding to one columnar body CL is represented. The columnar body CL to which no contact CV is connected in the illustrated region is connected to the contact CV in a region (not illustrated). One conductive layer 32 (bit line BL) is in contact with the underside of the contact CV.

The columnar contact V1 is provided below the conductive layer 32. A conductive layer 35 is provided below the contact V1. The conductive layer 32 and the conductive layer 35 are electrically connected to each other via the contact V1. The conductive layer 35 is a wiring used for the connection of a circuit in the semiconductor storage device 1.

The columnar contact V2 is provided below the conductive layer 35. The first pad 36 is provided below the contact V2. The conductive layer 35 and the first pad 36 are electrically connected to each other via the contact V2. The first pad 36 is in contact with the interface S between the memory chip MC and the circuit chip CC, and functions as a bonding pad for the circuit chip CC. The first pad 36 contains, for example, copper.

Figure 5:
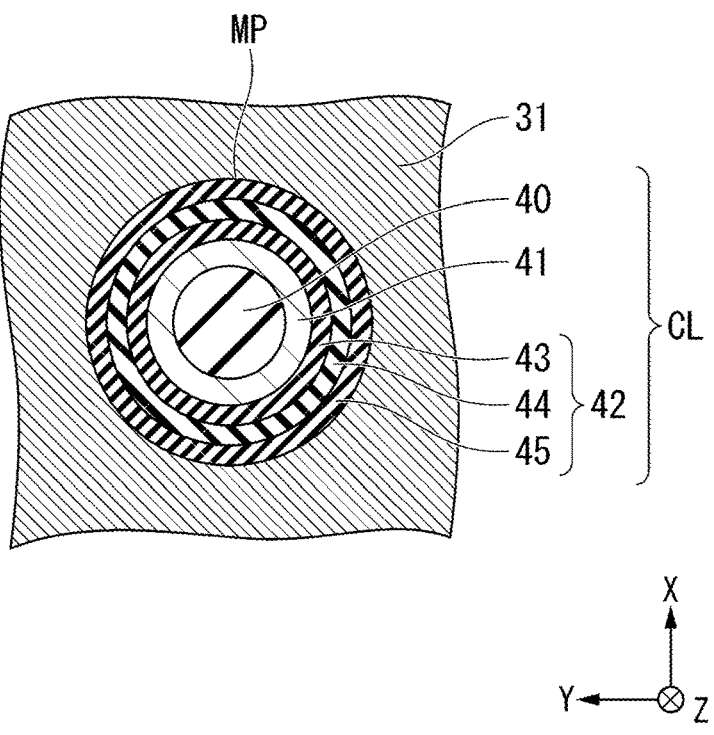
FIG. 5 is a cross-sectional view illustrating a columnar portion of the semiconductor storage device according to the first embodiment.

FIG. 5 is a cross-sectional view illustrating the columnar body CL of the semiconductor storage device 1 according to the first embodiment. Each of the plurality of columnar bodies CL in the memory region MR has the insulating core 40, the semiconductor channel 41, and the memory stacked film 42. The columnar body CL is formed in the memory hole MH, and includes the insulating core 40, the semiconductor channel 41, and the memory stacked film 42 in order from the inside.

The insulating core 40 extends in the Z direction and has a columnar shape. The insulating core 40 contains, for example, a silicon oxide. The insulating core 40 is provided in the central portion including the central axis of the memory hole MH when viewed from the Z direction.

The semiconductor channel 41 extends in the Z direction. For example, at least a part of the semiconductor channel 41 is formed in an annular shape, and covers the outer surface (outer peripheral surface) of the insulating core 40. The semiconductor channel 41 contains, for example, silicon. Silicon is, for example, polysilicon obtained by crystallizing amorphous silicon. The semiconductor channel 41 functions as a channel of each of the first select transistor S1, the plurality of memory cell transistors MT, and the second select transistor S2. The term "channel" as used herein is a carrier flow path between the source side and the drain side.

The memory stacked film 42 extends in the Z direction. The memory stacked film 42 covers the outer surface (outer peripheral surface) of the semiconductor channel 41. The memory stacked film 42 is located between the inner surface (inner peripheral surface) of the memory hole MH and the outer surface (outer peripheral surface) of the semiconductor channel 41. The memory stacked film 42 includes, for example, a tunnel insulating film 43, a charge storage film 44, and a block insulating film 45. Such a plurality of films is provided in the order of the tunnel insulating film 43, the charge storage film 44, and the block insulating film 45 from the semiconductor channel 41.

The tunnel insulating film 43 covers the outer surface of the semiconductor channel 41. That is, the tunnel insulating film 43 is located between the charge storage film 44 and the semiconductor channel 41. The tunnel insulating film 43 contains, for example, a silicon oxide, or a silicon oxide and a silicon nitride. The tunnel insulating film 43 is a potential barrier located between the semiconductor channel 41 and the charge storage film 44.

The charge storage film 44 covers the outer surface of the tunnel insulating film 43. That is, the charge storage film 44 is located between each of the insulating layer 21 and the first conductive layer 31 and the tunnel insulating film 43. The charge storage film 44 contains, for example, a silicon nitride. Portions where the charge storage film 44 and the plurality of first conductive layers 31 intersect with each other function as a transistor, respectively. The memory cell transistor MT stores data according to the presence or absence of electric charges in the portion (charge storage portion) where the charge storage film 44 intersects with each of the plurality of first conductive layers 31, or the amount of stored electric charges. The charge storage portion is located between each of the first conductive layers 31 and the semiconductor channel 41, and is surrounded by an insulating material. The charge storage film 44 is an example of a "memory film".

The block insulating film 45 prevents back tunneling. Back tunneling is a phenomenon in which electric charges return from the first conductive layer 31 to the memory stacked film 42. The block insulating film 45 may be located between the insulating layer 21 and the first conductive layer 31 and between the first conductive layer 31 and the charge storage film 44. The block insulating film 45 is a stacked structure film in which, for example, a silicon oxide film, a metal oxide film, and a plurality of insulating films are stacked. An example of a metal oxide is an aluminum oxide.

A barrier film (not illustrated) may be provided between the block insulating film 45 and the first conductive layer 31. The barrier film improves adhesion between the first conductive layer 31 and the block insulating film 45. The barrier film is, for example, a titanium nitride, or a stacked structure film of a titanium nitride and titanium.

A portion where the columnar body CL and the first conductive layer 31 functioning as the select gate line SGS intersect with each other functions as the second select transistor S2. A portion where the columnar body CL and the first conductive layer 31 functioning as the word line WL intersect with each other functions as the memory cell transistor MT. A portion where the columnar body CL and the first conductive layer 31 functioning as the select gate line SGD intersect with each other functions as the first select transistor S1.

As illustrated in FIG. 4, the memory chip MC and the circuit chip CC are bonded by the first pad 36 provided below the columnar body CL and a second pad 54 provided above a transistor Tr.

The circuit chip CC includes the substrate 50, the transistor Tr, and the second pad 54 provided above the transistor Tr. The circuit chip CC functions as a control circuit (logic circuit) that controls an operation of the memory chip MC, and includes, for example, a structure corresponding to the row decoder 11, the sense amplifier 12, and the sequencer 13.

The substrate 50 is used to form the circuit chip CC. The substrate 50 is, for example, a semiconductor substrate containing a p-type impurity. The transistor Tr is provided on the substrate 50. A plurality of contacts and a plurality of conductor layers are provided on the substrate 50 to correspond to a source and a drain of the transistor Tr. The plurality of conductor layers are electrically connected via the contacts. The uppermost conductor layer of the circuit chip CC among the plurality of conductor layers is the second pad 54. The second pad 54 is in contact with the interface S between the circuit chip CC and the memory chip MC, and functions as a bonding pad for the memory chip MC. The second pad 54 contains, for example, copper.

Each conductor layer (including the second pad 54) in the circuit chip CC is electrically connected to one bit line BL. Although not illustrated, a plurality of transistors having the same structure as the transistor Tr are provided in the circuit chip CC.

The memory chip MC and the circuit chip CC of the semiconductor storage device 1 may have any other cross-sectional structures. The number of wiring layers provided in the circuit chip CC may be designed to be any number. Further, the contacts connected to each of the conductor layers in the circuit chip CC may be appropriately omitted according to the design of the circuit. The layout of a wiring for interconnecting the circuit in the memory chip MC and the circuit in the circuit chip CC may be appropriately changed.

Figure 6A:
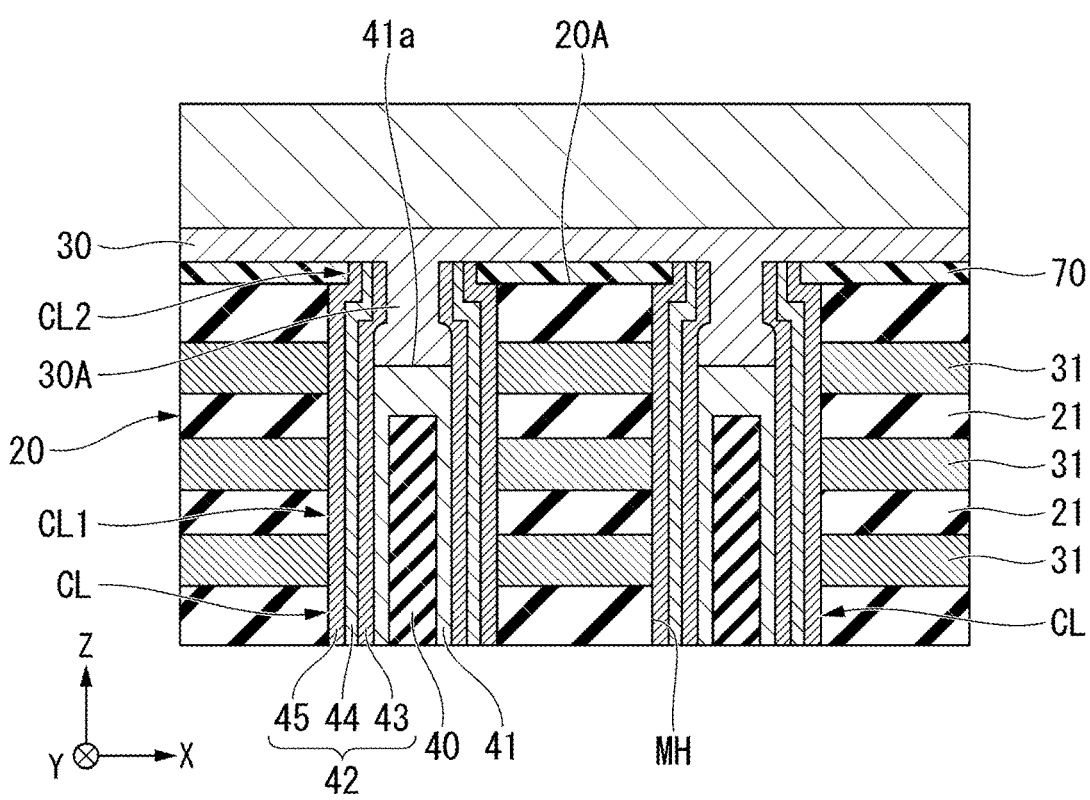
FIG. 6A is a cross-sectional view illustrating a part of the semiconductor storage device according to the first embodiment.
Figure 6B:
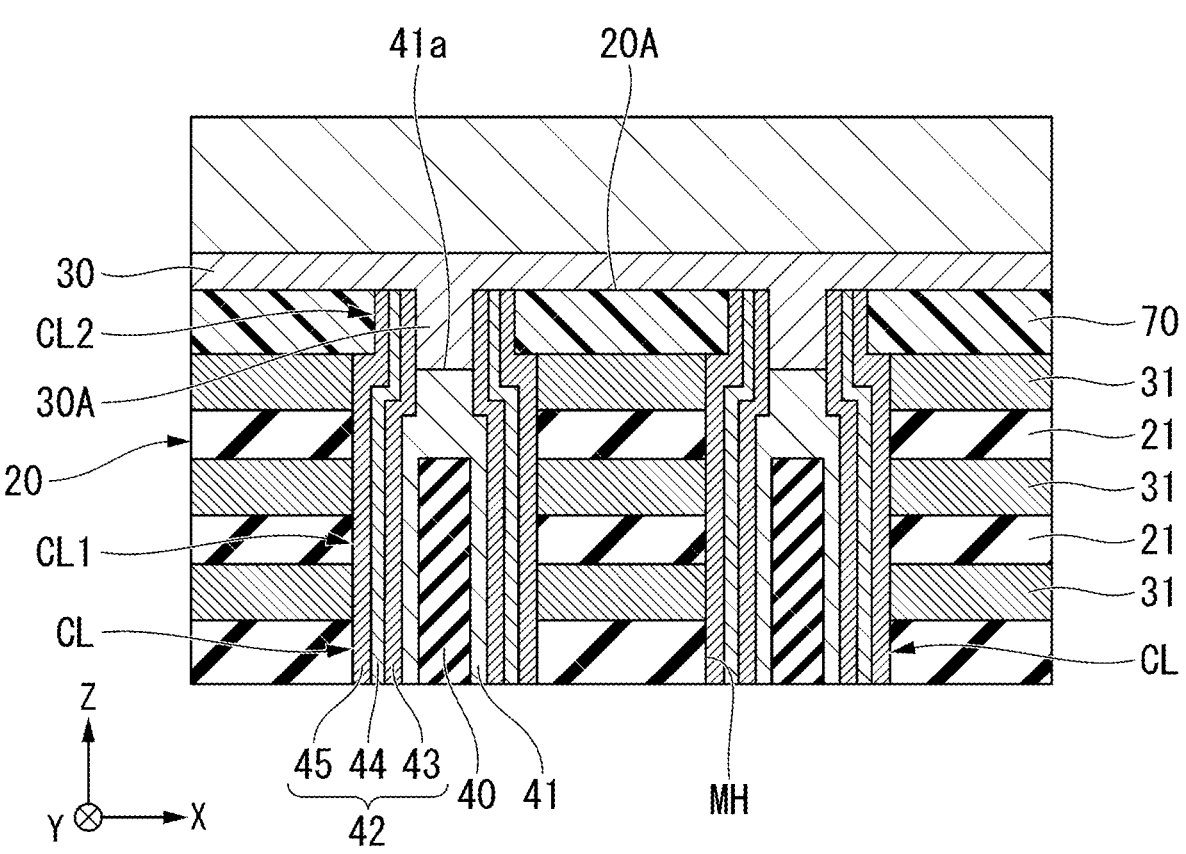
FIG. 6B is a cross-sectional view illustrating a part of the semiconductor storage device according to the first embodiment.

Next, the structure of a connection portion between the columnar body CL and the second conductive layer 30 (source line SL) of the semiconductor storage device 1 will be described. FIGS. 6A and 6B are cross-sectional views illustrating a part of the semiconductor storage device 1 according to the first embodiment. In addition, FIGS. 6A and 6B differ only in the material (that is, a function) employed as an intermediate layer 70 and the presence or absence of the insulating layer 21 between the intermediate layer 70 and the uppermost first conductive layer 31, and the other configurations thereof are the same. Thus, in FIGS. 6A and 6B, the same reference numerals will be given to components having the same or similar functions.

As illustrated in FIGS. 6A and 6B, the upper portion of the columnar body CL is in contact with the second conductive layer 30 (source line SL). In the columnar body CL, an upper surface of the insulating core 40 is located lower than the upper end of the columnar body CL. That is, the upper surface of the insulating core 40 is at a position lower than the height of an upper surface 20A of the stack 20. The upper surface of the insulating core 40 may be lower than the uppermost first conductive layer 31 among the plurality of first conductive layers 31. Further, the upper surface of the insulating core 40 is covered with the semiconductor channel 41.

An upper end of the semiconductor channel 41 located on the insulating core 40 is formed in a cylindrical shape inside the memory stacked film 42 in a plan view from the Z direction. Further, the width in the X direction of a cylindrical portion of the semiconductor channel 41 is greater than the width in the X direction of the insulating core 40 at the height of the upper surface of the insulating core 40.

An upper surface 41a of the semiconductor channel 41 (an upper surface of the above-mentioned cylindrical portion) is in contact with a protrusion 30A of the second conductive layer 30 (to be described later). The upper surface 41a of the semiconductor channel 41 may be at the same position as the uppermost first conductive layer 31 among the plurality of first conductive layers 31.

The second conductive layer 30 has a main body portion that is provided above the upper surface 20A of the stack and the protrusion 30A that protrudes from the main body portion toward the upper surface of the insulating core 40 to extend in the Z direction within the columnar body CL. That is, the protrusion 30A protrudes from the main body portion toward the upper surface of the insulating core 40 at least at a position where the protrusion 30A overlaps with the insulating core 40 (for example, a position where the protrusion 30A overlaps with the insulating core 40 and the semiconductor channel 41) in a plan view from the Z direction.

The protrusion 30A protrudes toward the inside of the memory hole MH as described above. A lower surface (bottom surface) of the protrusion 30A and the upper surface 41a of the semiconductor channel 41 are in surface contact with each other. That is, an interface between the protrusion 30A and the semiconductor channel 41 is located lower than the upper surface 20A of the stack 20. A contact portion between the semiconductor channel 41 and the protrusion 30A forms a Schottky junction.

At least a part of the interface between the protrusion 30A and the semiconductor channel 41 may be at the same position as the uppermost first conductive layer 31 of the stack 20 in the Z direction. That is, at least a part of the interface between the protrusion 30A and the semiconductor channel 41 may be at the same position as the first conductive layer 31 functioning as the select gate line SGS on the source side in the Z direction. In addition, as illustrated in FIGS. 6A and 6B, the entire interface between the second conductive layer 30 and the semiconductor channel 41 may be at the same position as the uppermost first conductive layer 31 of the stack 20 in the Z direction.

In the upper portion of the columnar body CL, a part of the memory stacked film 42 may protrude upward from the upper surface 20A of the stack 20. That is, at least one of the tunnel insulating film 43, the charge storage film 44, and the block insulating film 45 may protrude upward from the upper surface 20A of the stack 20. The position of the upper end of the memory stacked film 42 may be the position of the upper surface 20A of the stack 20.

Further, as illustrated in FIGS. 6A and 6B, the columnar body CL may have a first columnar portion CL1 and a second columnar portion CL2 on the first columnar portion CL1 in the stack 20. The second columnar portion CL2 is configured with a part of the memory stacked film 42. The second columnar portion CL2 is provided, for example, above the uppermost first conductive layer 31. Further, the outer peripheral length of the second columnar portion CL2 is shorter than the outer peripheral length of the first columnar portion CL1. The outer peripheral length of the second columnar portion CL2 may be gradually shortened from the first columnar portion CL1 toward the upper surface of the stack 20. A part of the second columnar portion CL2 may protrude upward from the upper surface 20A of the stack 20.

Further, as illustrated in FIGS. 6A and 6B, the intermediate layer 70 may be provided between the second conductive layer 30 and the stack 20. In a manufacturing method to be described later, the intermediate layer 70 is formed on a substrate 60 and functions as a stopper film when creating the memory hole MH. In the manufacturing process, the entirety of the intermediate layer 70 may be removed, or a part of the intermediate layer 70 may remain. When a part of the intermediate layer 70 remains, such a part is provided between the second conductive layer 30 and the stack 20, as illustrated to FIGS. 6A and 6B.

The intermediate layer 70 is, for example, polysilicon, a silicon carbonitride, a silicon carbide, a high-k material (high dielectric constant material), or an aluminum oxide.

When the intermediate layer 70 is made of polysilicon, the entirety of the intermediate layer 70 may be removed or a part of the intermediate layer 70 may remain, after the intermediate layer 70 functions as the above-mentioned stopper film. When a part of the intermediate layer 70 made of polysilicon remains, the intermediate layer 70 functions as a part of the second conductive layer 30 (see, for example, FIG. 6A).

When the intermediate layer 70 is made of a silicon carbonitride, a silicon carbide, or a high-k material (high dielectric constant material), at least a part of the intermediate layer 70 may remain after the intermediate layer 70 functions as the above-mentioned stopper film. The remaining intermediate layer 70 then functions as an insulating film between the second conductive layer 30 and the first conductive layer 31 (select gate line SGS) (see, for example, FIG. 6B).

Next, a method of manufacturing the semiconductor storage device 1 according to the first embodiment will be described. FIGS. 7 to 10 are cross-sectional views illustrating the method of manufacturing the semiconductor storage device 1 according to the first embodiment.

Figure 7:
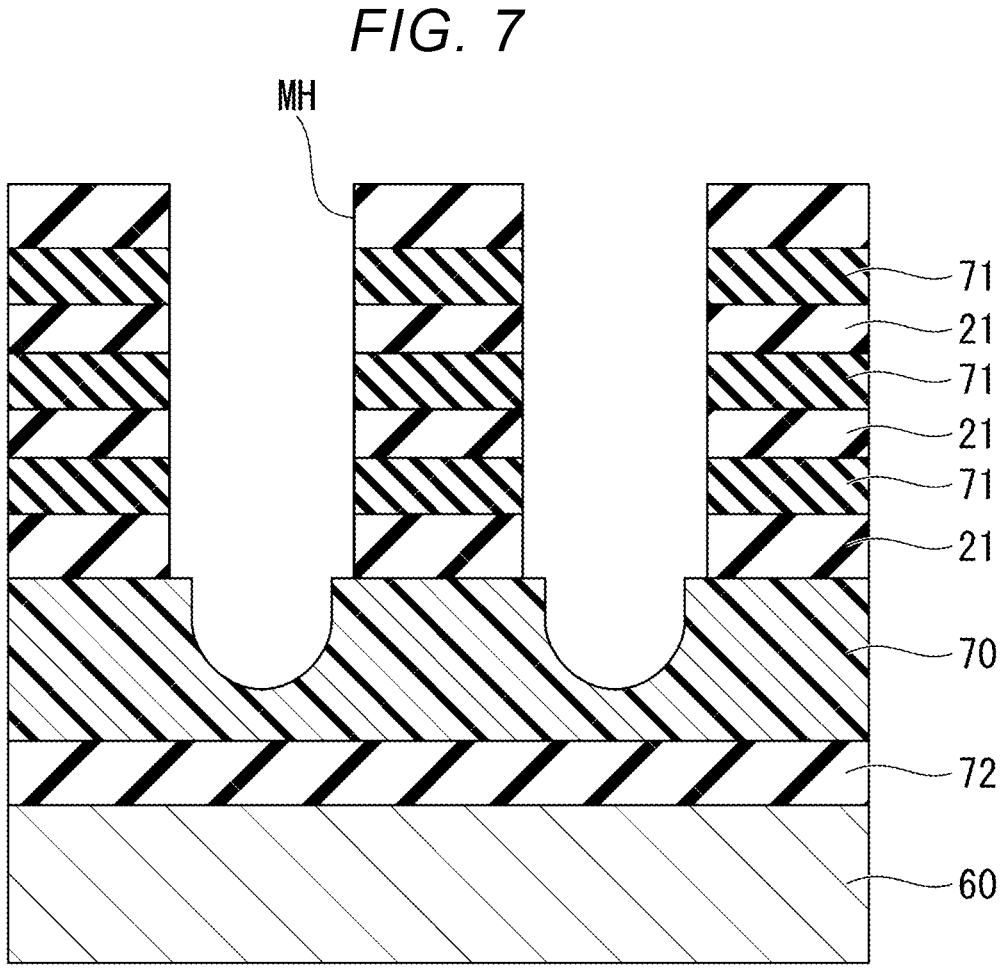
FIG. 7 is a cross-sectional view illustrating a method of manufacturing the semiconductor storage device according to the first embodiment.
Figure 7:
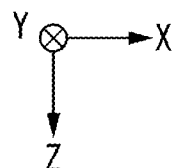

First, the memory chip MC is formed. The memory chip MC is formed using the substrate 60. The substrate 60 is, for example, a semiconductor substrate such as a silicon substrate. Then, as illustrated in FIG. 7, the intermediate layer 70 is formed on the substrate 60, and in turn, the plurality of insulating layers 21 and a plurality of sacrificial layers 71 are alternately stacked one by one on the intermediate layer 70 to form a stack. In addition, FIG. 7 illustrates a case where polysilicon is employed as the material of the intermediate layer, and when forming the stack on the intermediate layer 70, the insulating layer 21 and the sacrificial layer 71 are stacked in this order on the intermediate layer 70. Meanwhile, when a silicon carbonitride (SiCN), a silicon carbide (SiC), or a high-k material (a high dielectric constant material) is used as the intermediate layer 70, the sacrificial layer 71 and the insulating layer 21 are stacked in this order on the intermediate layer 70. This is because the intermediate layer 70 functions as an insulating film located on the first conductive layer 31 in the semiconductor storage device 1.

The intermediate layer 70 is formed on the substrate 60 and spreads in the X direction and the Y direction. The intermediate layer 70 is, for example, polysilicon, a silicon carbonitride, a silicon carbide, a high-k material (high dielectric constant material), or an aluminum oxide. The intermediate layer 70 functions as a layer that controls the inner peripheral length of the memory hole MH when forming the memory hole MH in a subsequent step. That is, when forming the memory hole MH penetrating the plurality of insulating layers 21 and the plurality of sacrificial layers 71, the inner peripheral length of the memory hole MH is gradually shortened at a position corresponding to the intermediate layer 70 from the stack toward the substrate 60 by the intermediate layer 70. In other words, the end of the memory hole MH on the substrate 60 side is constricted at the position corresponding to the intermediate layer 70.

An insulating layer 72 may be provided between the intermediate layer 70 and the substrate 60. In this case, the insulating layer 72 may be made of the same material as the insulating layer 21.

In addition, when a silicon carbonitride (SiCN), a silicon carbide (SiC), or a high-k material (a high dielectric constant material) is used as the intermediate layer 70, the intermediate layer 70, the sacrificial layer 71, and the insulating layer 21 may be stacked in this order on the substrate 60 as described above. In this case, at least a part of the intermediate layer 70 may remain in a subsequent step. The remaining intermediate layer 70 functions as an insulating film located above the first conductive layer 31 (select gate line SGS).

The plurality of insulating layers 21 contain, for example, a silicon oxide. The plurality of sacrificial layers 71 contain, for example, a silicon nitride. The sacrificial layer 71 is replaced with the first conductive layer 31 in a subsequent step (replacement step).

Next, the memory hole MH is formed to penetrate the stack including the plurality of insulating layers 21 and the plurality of sacrificial layers 71. The memory hole MH is formed up to the inside of the intermediate layer 70. Further, the insulating layer 21 and the sacrificial layer 71 are formed of materials having different etching rates. Therefore, the inner peripheral length of the memory hole MH at a position corresponding to the sacrificial layer 71 is gradually shortened from the stack toward the substrate 60. The lower end of the memory hole MH on the substrate 60 side may penetrate the intermediate layer 70 and reach the substrate 60.

Figure 8:
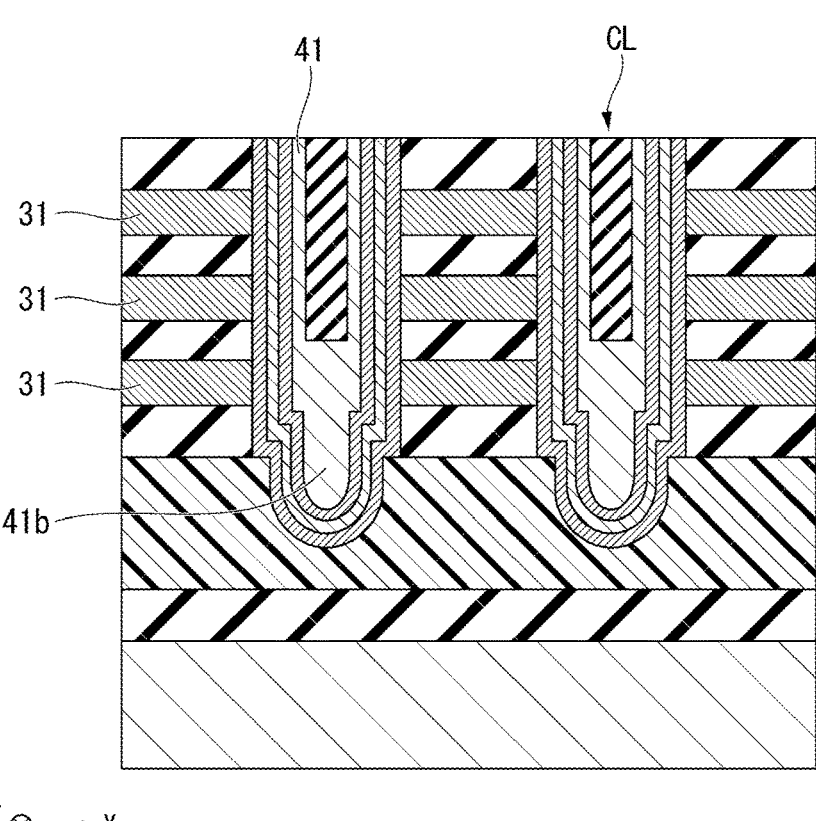
FIG. 8 is a cross-sectional view illustrating the method of manufacturing the semiconductor storage device according to the first embodiment.
Figure 8:
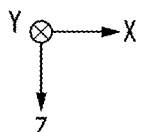

Next, as illustrated in FIG. 8, the plurality of columnar bodies CL extending in the Z direction are formed in the stack including the plurality of insulating layers 21 and the plurality of sacrificial layers 71. Specifically, the memory stacked film 42, the semiconductor channel 41, and the insulating core 40 are formed in this order within the memory hole MH to form the columnar body CL. Since the lower end of the memory hole MH is constricted at the position corresponding to the intermediate layer 70 as illustrated in FIG. 8, the columnar body CL is also constricted toward the substrate 60. Further, since the lower end of the memory hole MH is constricted, the thickness in the X direction of a thickness portion 41b of the semiconductor channel 41 which corresponds to the position of the lower end of the memory hole MH is greater than the thickness in the X direction of a portion of the semiconductor channel 41 which extends along the inner surface of the memory hole MH (the portion extending in the Z direction). That is, the semiconductor channel 41 is formed so that the thickness of the lower end thereof on the substrate 60 side is increased. When the lower end of the memory hole MH on the substrate 60 side penetrates the intermediate layer 70 and reaches the substrate 60, the thickness of the lower end of the semiconductor channel 41 is further increased.

After the columnar body CL is formed, the sacrificial layer 71 is replaced with the first conductive layer 31 by a replacement treatment (replacement step). Specifically, in the replacement treatment, after the sacrificial layer 71 is removed, the first conductive layer 31 is embedded in a space (cavity) from which the sacrificial layer 71 is removed.

In addition, the stack 20 may be produced by alternately stacking the plurality of insulating layers 21 and the plurality of first conductive layers 31 on the substrate 60 without performing the replacement step of the first conductive layer 31.

After the columnar body CL is formed, the insulating layer 22, the columnar contacts CV, V1, and V2, the conductive layer 32 (bit line BL), and the first pad 36 are formed above the columnar body CL (see, for example, FIG. 4), and the memory chip MC is produced.

Next, the circuit chip CC is prepared, and the memory chip MC and the circuit chip CC are bonded. Specifically, the memory chip MC and the circuit chip CC are brought into contact with each other in a state where the first pad 36 exposed on the memory chip MC and the second pad 54 exposed on the circuit chip CC face each other in the Z direction. Thereafter, a heat treatment is executed, so that the first pad 36 and the second pad 54 facing each other are bonded. Thus, the memory chip MC and the circuit chip CC are electrically connected.

Figure 9:
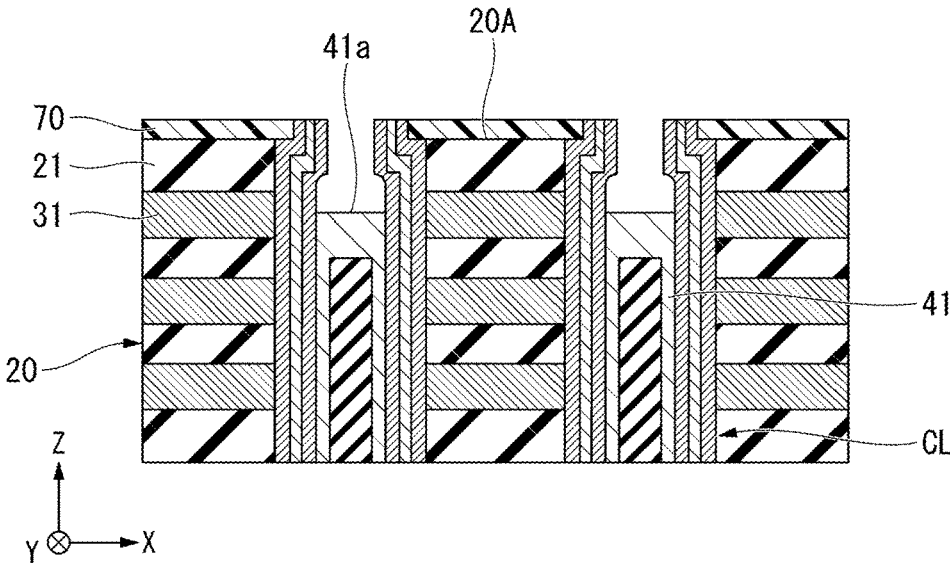
FIG. 9 is a cross-sectional view illustrating the method of manufacturing the semiconductor storage device according to the first embodiment.

Next, as illustrated in FIG. 9, the substrate 60 and at least a part of the intermediate layer 70 of the memory chip MC are removed until the semiconductor channel 41 is exposed. The substrate 60 and the intermediate layer 70 are removed by, for example, etching or chemical mechanical polishing (CMP). By removing the substrate 60 and at least a part of the intermediate layer 70, the surface of each layer constituting the columnar body CL is exposed.

As illustrated in FIG. 9, the intermediate layer 70 may be removed to remain a part thereof. Alternatively, the entirety of the intermediate layer 70 may be removed. Further, when a silicon carbonitride (SiCN), a silicon carbide (SiC), or a high-k material (a high dielectric constant material) is used as the intermediate layer 70, at least a part of the intermediate layer 70 remains. The remaining intermediate layer 70 functions as an insulating film located above the first conductive layer 31 (select gate line SGS).

Next, the upper surface of the columnar body CL is etched so that the exposed surface of the semiconductor channel 41 is located at a position lower than the upper surface 20A of the stack 20. Specifically, when a part of the thickness portion 41b of the semiconductor channel 41 located at the upper end of the stack 20 is removed by etching, the upper surface 41a of the semiconductor channel 41 is located lower than the upper surface 20A of the stack 20. The etching of the upper surface of the columnar body CL is performed using, for example, an etchant by which the etching rate of the semiconductor channel 41 is higher than that of the charge storage film 44. In addition, the upper surface 41a of the semiconductor channel 41 may be formed at the same position as the uppermost first conductive layer 31 of the stack 20 in the Z direction.

Figure 10:
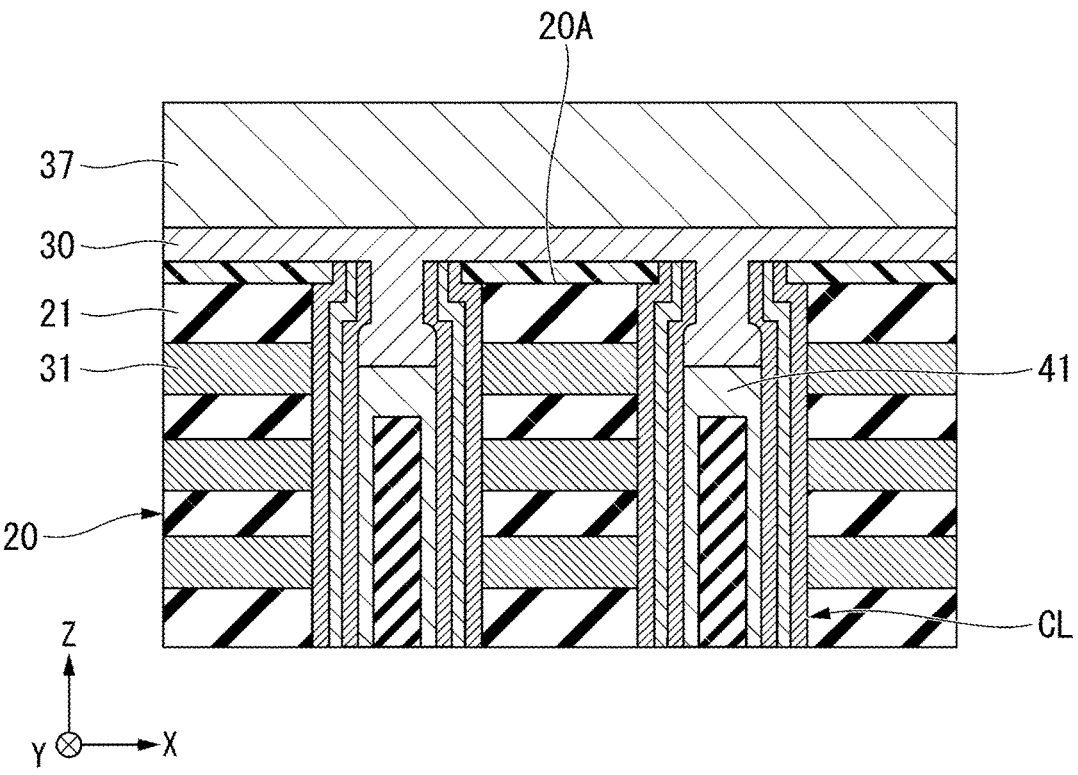
FIG. 10 is a cross-sectional view illustrating the method of manufacturing the semiconductor storage device according to the first embodiment.

Next, as illustrated in FIG. 10, the second conductive layer 30 is formed on the upper surface of the etched columnar body CL and the upper surface 20A of the stack 20. The second conductive layer 30 functions as a part of the source line SL. Further, a conductor layer 37 may further be provided above the second conductive layer 30.

The second conductive layer 30 is, for example, one or two or more selected from the group consisting of Ti, TiN, Ni, NiSi, and p-doped Si. The conductor layer 37 is, for example, aluminum, titanium, titanium nitride, tungsten, titanium nitride, or aluminum nitride. This metal used as the source line SL is created at a low temperature of, for example, 400 degrees or less. The set of the second conductive layer 30 and the conductor layer 37 functions as a part of the source line SL, and is connected to the upper surface 41a of the semiconductor channel 41 of each columnar body CL in the stack 20.

As described above, the structure is formed in which the protrusion 30A of the second conductive layer 30 and the upper surface 41a of the semiconductor channel 41 are electrically connected to each other. In addition, the manu facturing steps described above are only an example. Other steps may be inserted between the respective manufacturing steps.

In the semiconductor storage device 1 according to the first embodiment, the interface between the second conductive layer 30 and the upper surface 41a of the semiconductor channel 41 is located lower than the upper surface of the stack 20. Thus, it is possible to appropriately apply a voltage to a barrier portion for electrons flowing into the semiconductor channel 41 (the interface between a metal and a semiconductor), which may prevent deterioration of cell current.

Further, in the semiconductor storage device 1 according to the first embodiment, at least a part of the interface between the protrusion 30A and the semiconductor channel 41 may be at a position where it overlaps with the uppermost first conductive layer 31 of the stack 20 in the Z direction. Thus, the interface between the second conductive layer 30 and the upper surface 41a of the semiconductor channel 41 makes it easier to apply a voltage, and an erase operation may also be stabilized.

Further, in the semiconductor storage device 1 according to the first embodiment, the lower surface of the protrusion 30A of the second conductive layer 30 and the upper surface 41a of the semiconductor channel 41 may be in surface contact with each other. Thus, the area of the contact surface between the second conductive layer 30 and the semiconductor channel 41 may be sufficiently secured, which may avoid a contact failure.

First Modification

A first modification of the semiconductor storage device 1 according to the first embodiment will be described.

Figure 11:
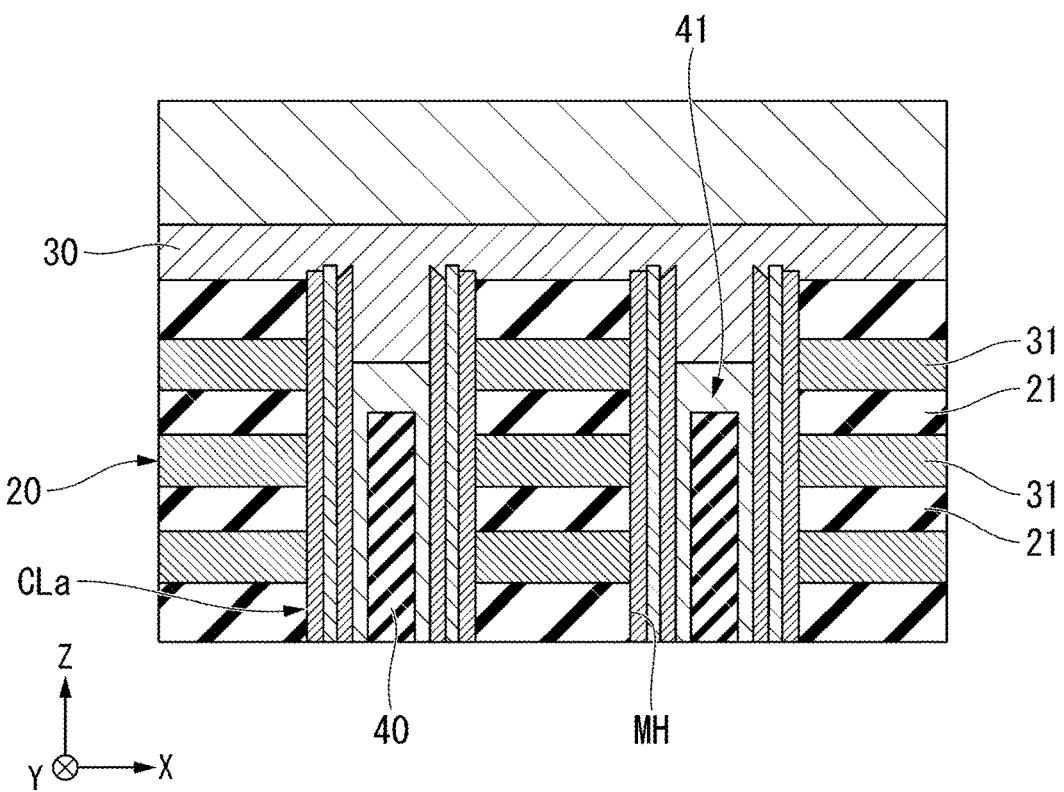
FIG. 11 is a cross-sectional view illustrating a part of the semiconductor storage device according to a first modification of the first embodiment.

FIG. 11 is a cross-sectional view illustrating a part of the semiconductor storage device 1 according to a first modification. The semiconductor storage device 1 of the first modification has the same configuration as that of the semiconductor storage device 1 of the first embodiment except for a configuration described below.

In the semiconductor storage device 1 of the first modification, as illustrated in FIG. 11, the outer peripheral length of a columnar body CLa may be the same at the inside and the end of the stack 20. That is, the columnar body CL of the first embodiment is constricted in the upper portion of the stack 20 (see, for example, FIGS. 6A and 6B), while the columnar body CLa in the semiconductor storage device 1 of the first modification may not be constricted.

The method of manufacturing the semiconductor storage device 1 of the first modification is the same as the method of manufacturing the semiconductor storage device 1 of the first embodiment except that the sacrificial layer 71 is not formed. That is, in the method of manufacturing the semiconductor storage device 1 of the first modification, the sacrificial layer 71 is not formed on the substrate 60, and the plurality of insulating layers 21 and the plurality of first conductive layers 31 are alternately stacked on the substrate 60.

Similarly to the first embodiment, the configuration according to the first modification may prevent deterioration of cell current of the semiconductor storage device 1.

Second Modification

A second modification of the semiconductor storage device 1 of the first embodiment will be described.

Figure 12:
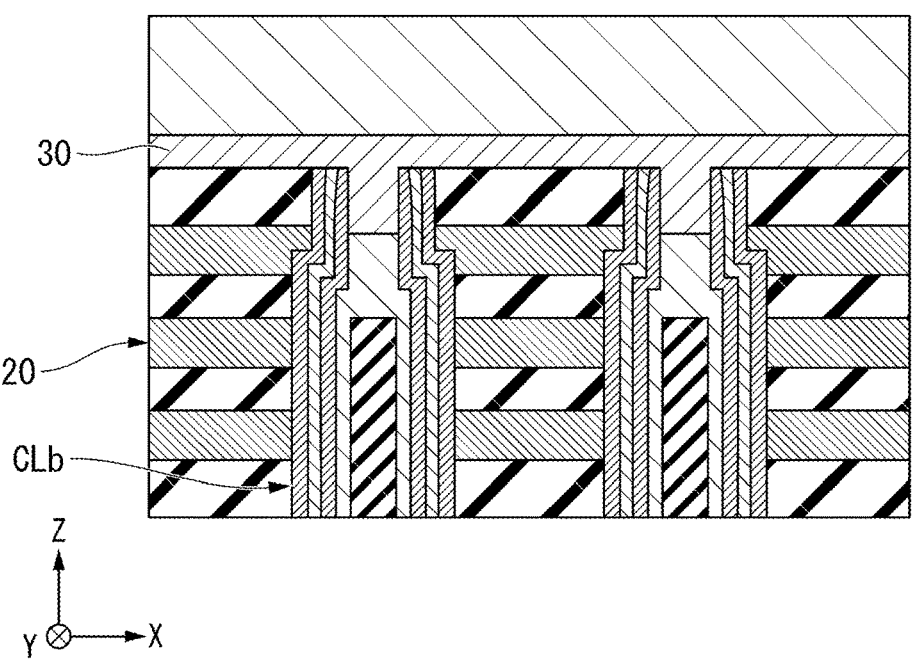
FIG. 12 is a cross-sectional view illustrating a part of the semiconductor storage device according to a second modification of the first embodiment.

FIG. 12 is a cross-sectional view illustrating a part of the semiconductor storage device 1 according to a second modification. The semiconductor storage device 1 of the second modification has the same configuration as that of the semiconductor storage device 1 of the first embodiment except for a configuration described below.

In the semiconductor storage device 1 of the second modification, the intermediate layer 70 in the semiconductor storage device 1 of the first embodiment is omitted. That is, in the semiconductor storage device 1 of the second modification, the second conductive layer 30 is provided above the stack 20.

Figure 13:
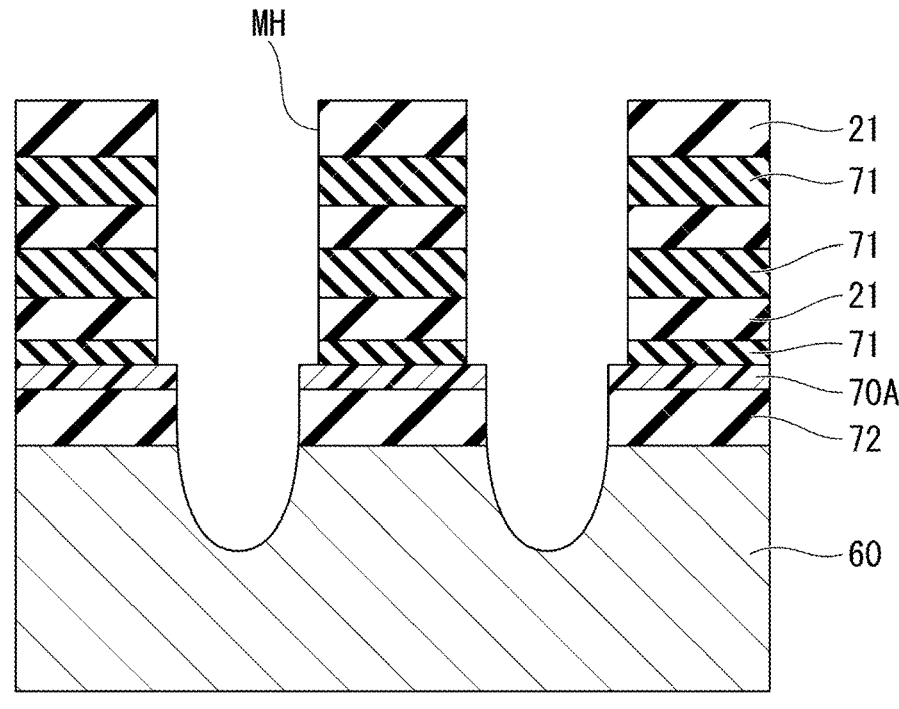
FIG. 13 is a cross-sectional view illustrating the method of manufacturing the semiconductor storage device according to the second modification of the first embodiment.
Figure 13:
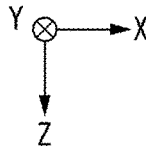
Figure 14:
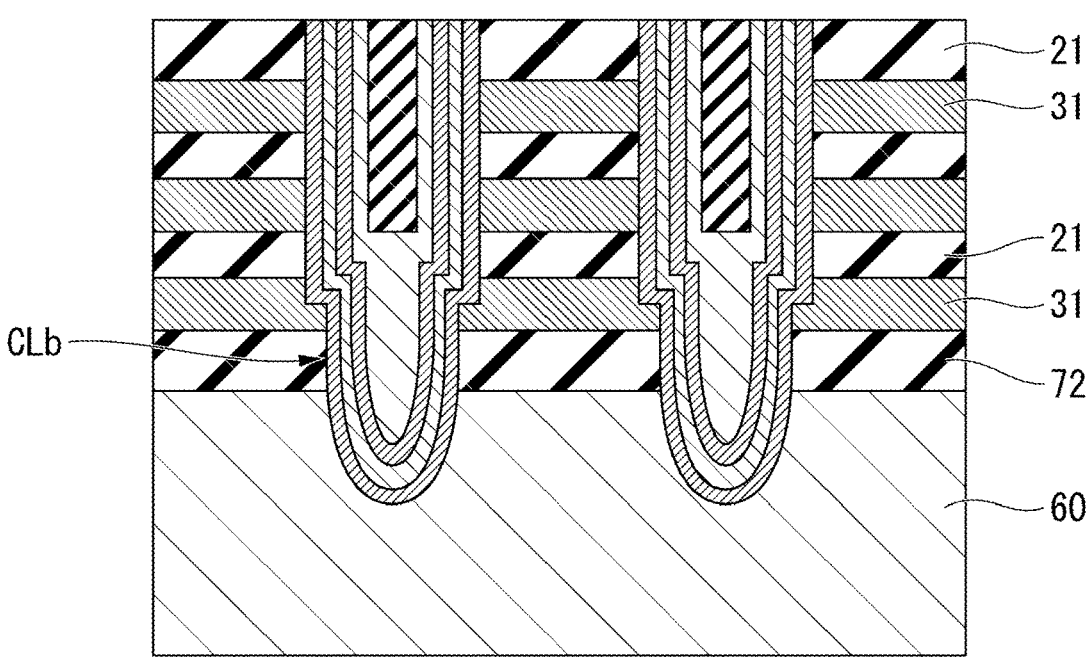
FIG. 14 is a cross-sectional view illustrating the method of manufacturing the semiconductor storage device according to the second modification of the first embodiment.
Figure 14:
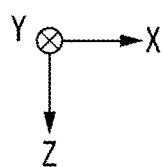

FIGS. 13 and 14 are cross-sectional views illustrating the method of manufacturing the semiconductor storage device 1 according to the second modification of the first embodiment.

In the method of manufacturing the semiconductor storage device 1 of the second modification, an aluminum oxide is used as an intermediate layer 70A. Specifically, as illustrated in FIG. 13, the insulating layer 72 is formed on the substrate 60, and in turn, the intermediate layer 70A containing an aluminum oxide is formed on the insulating layer 72. Next, the plurality of insulating layers 21 and the plurality of sacrificial layers 71 are alternately stacked on the intermediate layer 70A to form a stack.

Next, similarly to the first embodiment, as illustrated in FIG. 14, a columnar body CLb is produced in the memory hole MH, and the sacrificial layer 71 is replaced with the first conductive layer 31 by a replacement step. At this time, the intermediate layer 70A containing $Al_2O_3$ is also replaced, along with the sacrificial layer 71, with the first conductive layer 31 by the replacement step. In addition, since the intermediate layer 70A containing $Al_2O_3$ is also replaced along with the sacrificial layer 71, in FIG. 13, the sacrificial layer 71 directly above the intermediate layer 70A may be omitted.

The semiconductor storage device 1 manufactured by the manufacturing method of the second modification may have a configuration in which no sacrificial layer is formed between the stack 20 and the second conductive layer 30, as illustrated in FIG. 12.

Similarly to the first embodiment, the configuration according to the second modification may prevent deterioration of cell current of the semiconductor storage device 1.

Third Modification

A third modification of the semiconductor storage device 1 of the first embodiment will be described.

Figure 15:
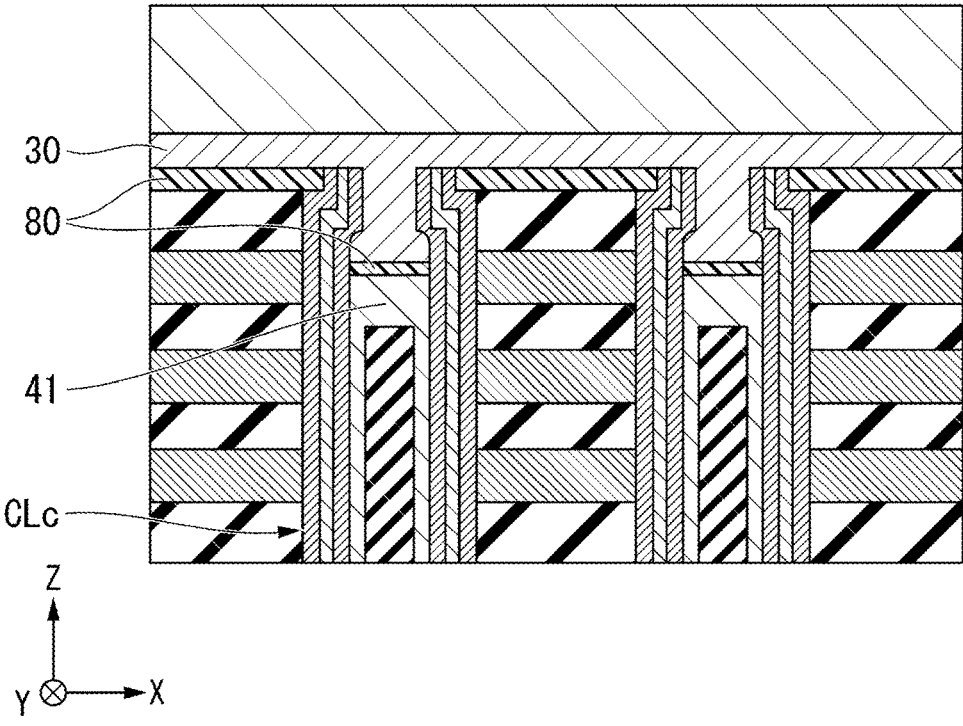
FIG. 15 is a cross-sectional view illustrating a part of the semiconductor storage device according to a third modification of the first embodiment.

FIG. 15 is a cross-sectional view illustrating a part of a columnar body CLc of the semiconductor storage device 1 according to a third modification. The semiconductor storage device 1 of the third modification has the same configuration as that of the semiconductor storage device 1 of the first embodiment except for a configuration described below.

The semiconductor storage device of the third modification may have a structure in which a silicide layer 80 is formed at the connection portion between the semiconductor channel 41 and the second conductive layer 30 and at the interface between the stack 20 and the second conductive layer 30. The silicide layer 80 located at the connection portion between the semiconductor channel 41 and the second conductive layer 30 is a portion in which an upper portion of the semiconductor channel 41 is silicided. That is, the silicide layer 80 located at the upper portion of the semiconductor channel 41 is at a position where it overlaps with the semiconductor channel 41 when viewed from the Z direction. Meanwhile, the silicide layer 80 located at the interface between the stack 20 and the second conductive layer 30 is a portion in which the intermediate layer 70 made of polysilicon is silicided when the intermediate layer 70 remains in the manufacturing process. That is, when the entirety of the intermediate layer 70 is removed in the manufacturing process, the silicide layer 80 located at the interface between the stack 20 and the second conductive layer 30 as illustrated in FIG. 15 is omitted. Further, when a silicon carbonitride (SiCN), a silicon carbide (SiC), or a high-k material (high dielectric constant material) is used as the intermediate layer 70 (see, for example, FIG. 6B), the silicide layer 80 is formed only at the upper portion of the semiconductor channel 41. As for a metal used for the silicide layer 80, for example, nickel may be used.

In the method of manufacturing the semiconductor storage device 1 of the third modification, first, the substrate 60 and a part of the intermediate layer 70 are removed to expose the upper surface of the semiconductor channel 41 (see, for example, FIG. 9). Thereafter, a metal used for silicide is formed on the upper surface of the semiconductor channel 41 and the upper surface of the intermediate layer 70, and is further heated to form the silicide layer 80.

In addition, in the manufacturing method of not using the intermediate layer 70 as in the first modification, a metal used for silicide is formed on the upper surface of the semiconductor channel 41 and the upper surface of the stack 20. In this case, the silicide layer 80 is formed only on the upper surface of the semiconductor channel 41, and no silicide is formed on the stack 20, so that the metal remains as it is. This remaining metal film for silicide on the stack 20 may be removed, or may remain as a part of the second conductive layer 30.

Further, the semiconductor storage device 1 of the second modification illustrated in FIG. 12 may also have a structure in which silicide is formed at the connection portion between the semiconductor channel 41 and the second conductive layer 30 and at the interface between the stack 20 and the second conductive layer 30 as in the third modification.

Similarly to the first embodiment, the configuration according to the third modification may prevent deterioration of cell current of the semiconductor storage device 1.

Fourth Modification

A fourth modification of the semiconductor storage device 1 of the first embodiment will be described.

Figure 16:
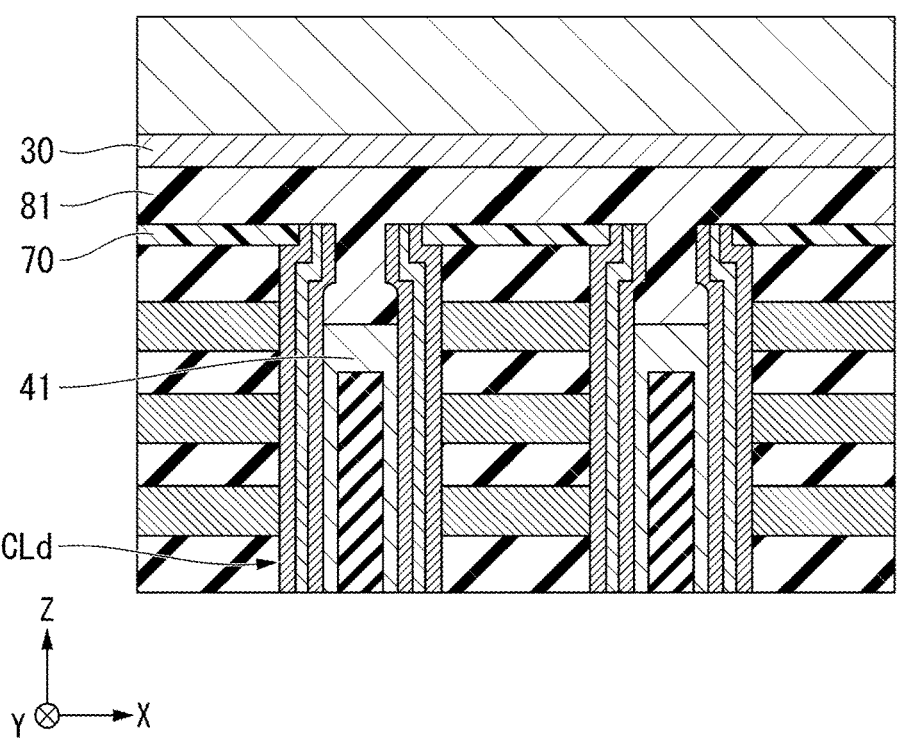
FIG. 16 is a cross-sectional view illustrating a part of the semiconductor storage device according to a fourth modification of the first embodiment.

FIG. 16 is a cross-sectional view illustrating a part of the semiconductor storage device 1 according to a fourth modification. The semiconductor storage device 1 of the fourth modification has the same configuration as that of the semiconductor storage device 1 of the first embodiment except for a configuration described below.

The semiconductor storage device 1 of the fourth modification has a structure in which a polysilicon layer 81 doped with an n-type impurity is formed at the interface between the second conductive layer 30 and the intermediate layer 70 and at the interface between the second conductive layer 30 and the semiconductor channel 41. When polysilicon is doped with an n-type impurity, a heat treatment (annealing treatment) is performed to activate the doped impurity. The n-type impurity is, for example, phosphorus (P).

In the method of manufacturing the semiconductor storage device 1 of the fourth modification, first, the substrate 60 and a part of the intermediate layer 70 are removed to expose the upper surface of the semiconductor channel 41 (see, for example, FIG. 9). Thereafter, the polysilicon layer 81 doped with the n-type impurity is formed on the upper surface of the semiconductor channel 41 and the upper surface of the intermediate layer 70.

In addition, in the manufacturing method of not using the intermediate layer 70 as in the first modification, the polysilicon layer 81 is formed on the upper surface of the semiconductor channel 41 and the upper surface 20A of the stack 20.

Similarly to the first embodiment, the configuration according to the fourth modification may prevent deterioration of cell current of the semiconductor storage device 1.

Second Embodiment

A semiconductor storage device 1A of the second embodiment has a structure in which a side surface 30Ba of a protrusion 30B of the second conductive layer 30 is in contact with the inner peripheral surface of a semiconductor channel 41A. Hereinafter, the semiconductor storage device 1A according to the second embodiment will be described based on differences from the first embodiment. The configuration other than that described below is the same as the configuration of the semiconductor storage device 1 of the first embodiment.

Figure 17A:
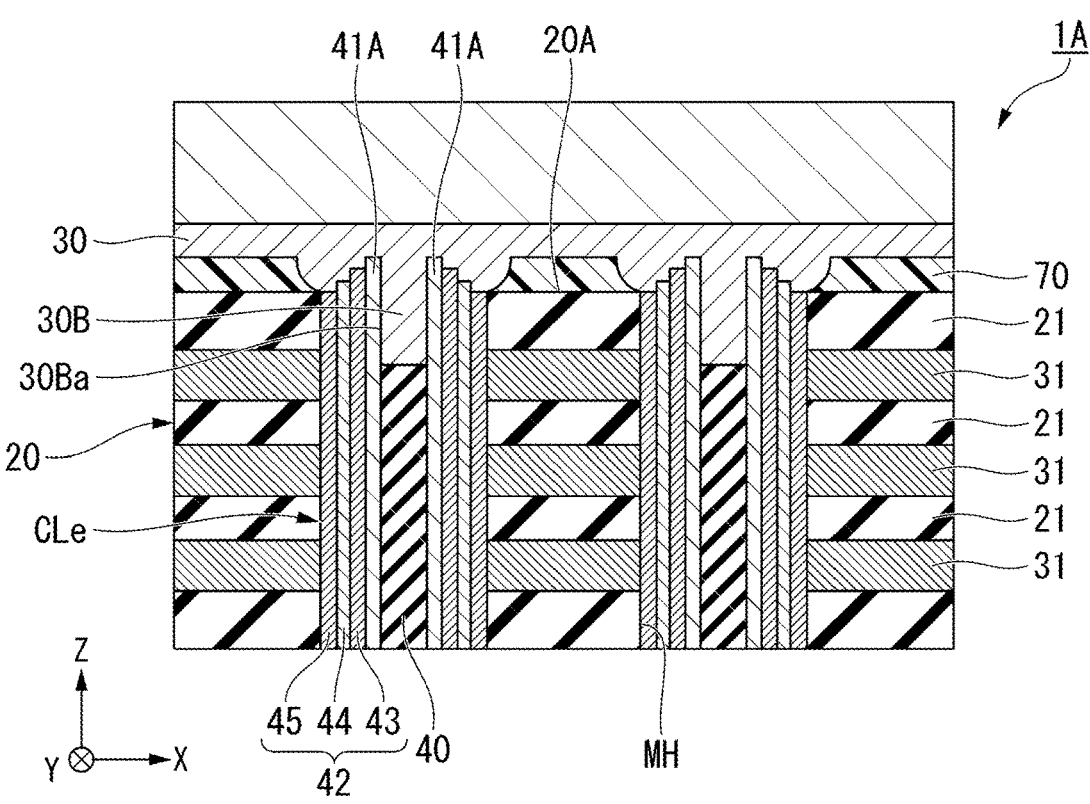
FIG. 17A is a cross-sectional view illustrating a part of a semiconductor storage device according to a second embodiment.
Figure 17B:
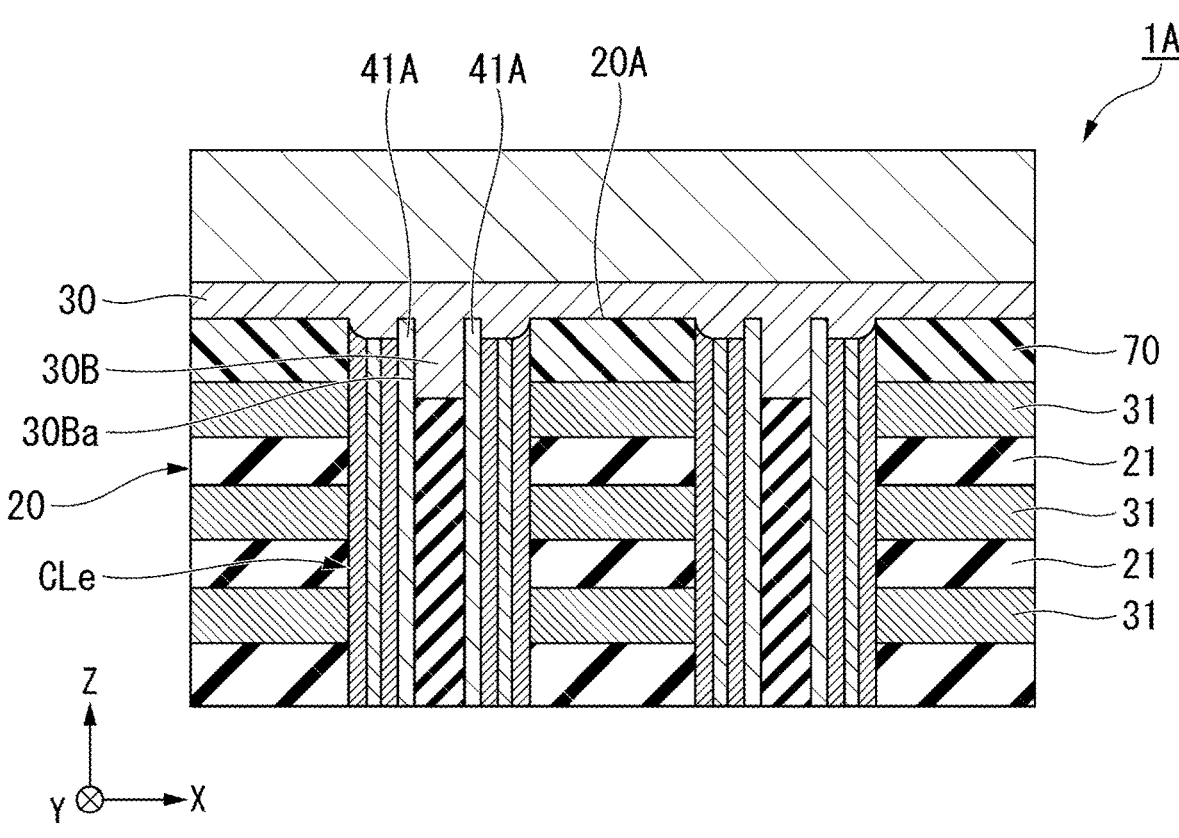
FIG. 17B is a cross-sectional view illustrating a part of the semiconductor storage device according to the second embodiment.

FIG. 17A is a cross-sectional view illustrating a part of the semiconductor storage device 1A according to the second embodiment. As illustrated in FIGS. 17A and 17B, the semiconductor storage device 1A of the second embodiment differs from the semiconductor storage device 1 of the first embodiment illustrated in FIGS. 6A and 6B only in the structure of the upper portion of the columnar body. Specifically, in the second embodiment, the semiconductor channel 41A has an annular cross-sectional shape along the X direction and the Y direction. Further, the side surface 30Ba of the protrusion 30B of the second conductive layer 30 is in contact with the inner peripheral surface of an upper portion of the semiconductor channel 41A.

The semiconductor channel 41A has a cylindrical shape extending in the Z direction, and has an upper portion extending from the insulating core 40 toward the second conductive layer 30. The upper portion of the semiconductor channel 41A has an annular shape when viewed in the Z direction. The position of an upper surface of the semiconductor channel 41A may be, for example, the same as that of the uppermost insulating layer 21, or may be higher than an upper surface of the uppermost insulating layer 21 (the surface 20A of the stack 20).

The upper surface of the insulating core 40 is located lower than the upper surface 20A of the stack 20. The upper surface of the insulating core 40 may be at the same position as the uppermost first conductive layer 31.

The protrusion 30B of the second conductive layer 30 extends from the second conductive layer 30 toward the upper surface of the insulating core 40, and the protrusion 30B and the insulating core 40 are in contact with each other below the upper surface 20A of the stack 20. That is, the protrusion 30B of the second conductive layer 30 is provided inside the cylindrical semiconductor channel 41A. Thus, the side surface 30Ba of the protrusion 30B of the second conductive layer 30 is in contact with the inner peripheral surface of the upper portion of the semiconductor channel 41A.

As illustrated in FIG. 17A, in the second embodiment, the upper surface of the insulating core 40 is covered with the protrusion 30B of the second conductive layer 30. That is, the protrusion 30B is at a position where it overlaps with the insulating core 40 in a plan view from the Z direction.

The protrusion 30B protrudes from the upper surface 20A of the stack 20 toward the upper surface of the insulating core 40 in the memory hole MH. That is, at least a part of the interface between the protrusion 30B and the semiconductor channel 41A is located lower than the upper surface 20A of the stack 20. Further, in the second embodiment, the lower surface of the protrusion 30B and the upper surface of the insulating core 40 may be in surface contact with each other. Further, the side surface of the protrusion 30B of the second conductive layer 30 may be in contact with the inner peripheral surface of the semiconductor channel 41A. A contact portion between the semiconductor channel 41A and the protrusion 30B forms a Schottky junction.

At least a part of the interface between the protrusion 30B and the semiconductor channel 41 may be at the same position as the uppermost first conductive layer 31 of the stack 20 in the Z direction. That is, at least a part of the interface between the protrusion 30B and the semiconductor channel 41A may be at the same position as the first conductive layer 31 functioning as the select gate line SGS on the source side in the Z direction.

In an upper portion of a columnar body CLe, a part of the memory stacked film 42 may protrude upward from the upper surface 20A of the stack 20. That is, at least one of the tunnel insulating film 43, the charge storage film 44, and the block insulating film 45 may protrude upward from the upper surface 20A of the stack 20. The position of the upper end of the memory stacked film 42 may be the position of the upper surface 20A of the stack 20.

In addition, in the second embodiment, the semiconductor storage device 1A illustrated in FIG. 17B may be employed. Similarly to the first embodiment, FIGS. 17A and 17B differ only in the material (that is, a function) employed as the intermediate layer 70 and the presence or absence of the insulating layer 21 between the intermediate layer 70 and the uppermost first conductive layer 31, and the other configurations thereof are the same. Thus, in FIGS. 17A and 17B, the same reference numerals will be given to components having the same or similar functions.

Further, in the second embodiment, similarly to the first embodiment, the intermediate layer 70 may be omitted. That is, in a manufacturing method to be described later, the entirety of the intermediate layer 70 may be removed.

Next, a method of manufacturing the semiconductor storage device 1A according to the second embodiment will be described. FIGS. 18 to 24 are cross-sectional views illustrating the method of manufacturing the semiconductor storage device 1A according to the second embodiment.

Figure 18:
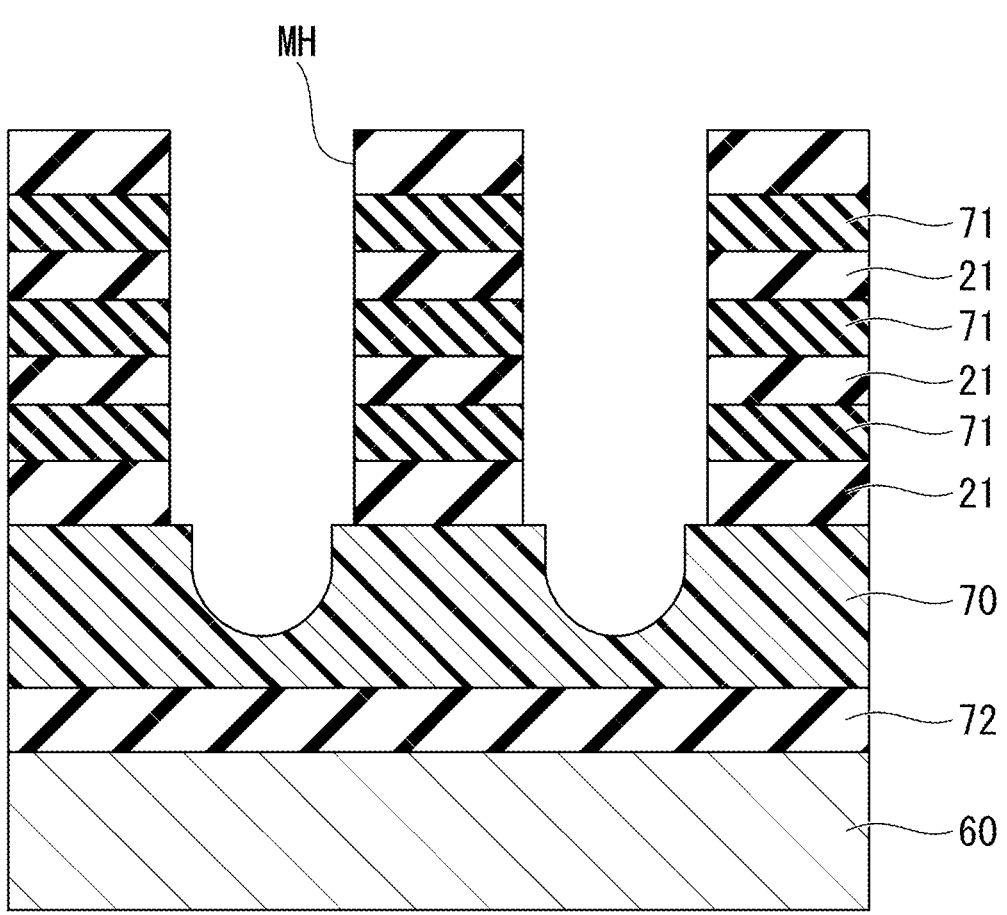
FIG. 18 is a cross-sectional view illustrating a method of manufacturing the semiconductor storage device according to the second embodiment.
Figure 18:
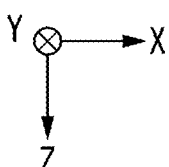

First, similarly to the first embodiment, as illustrated in FIG. 18, the intermediate layer 70 is formed on the substrate 60, and the plurality of insulating layers and the plurality of sacrificial layers 71 are alternately stacked on the intermediate layer 70 to form a stack. In addition, FIG. 18 illustrates a case where polysilicon is employed as the material of the intermediate layer, and when forming the stack on the intermediate layer 70, the insulating layer 21 and the sacrificial layer 71 are stacked in this order on the intermediate layer 70. Meanwhile, when a silicon carbonitride (SiCN), a silicon carbide (SiC), or a high-k material (a high dielectric constant material) is used as the intermediate layer 70, the sacrificial layer 71 and the insulating layer 21 are stacked in this order on the intermediate layer 70. This is because the intermediate layer 70 functions as an insulating film located on the first conductive layer 31 in the semiconductor storage device 1.

Next, the memory hole MH is formed to penetrate the stack including the plurality of insulating layers 21 and the plurality of sacrificial layers 71. The memory hole MH is formed up to the inside of the intermediate layer 70. Further, the insulating layer 21 and the intermediate layer 70 are formed of materials having different etching rates. Therefore, the inner peripheral length of the memory hole MH at a position corresponding to the sacrificial layer 71 is gradually shortened from the stack toward the substrate 60.

Figure 19:
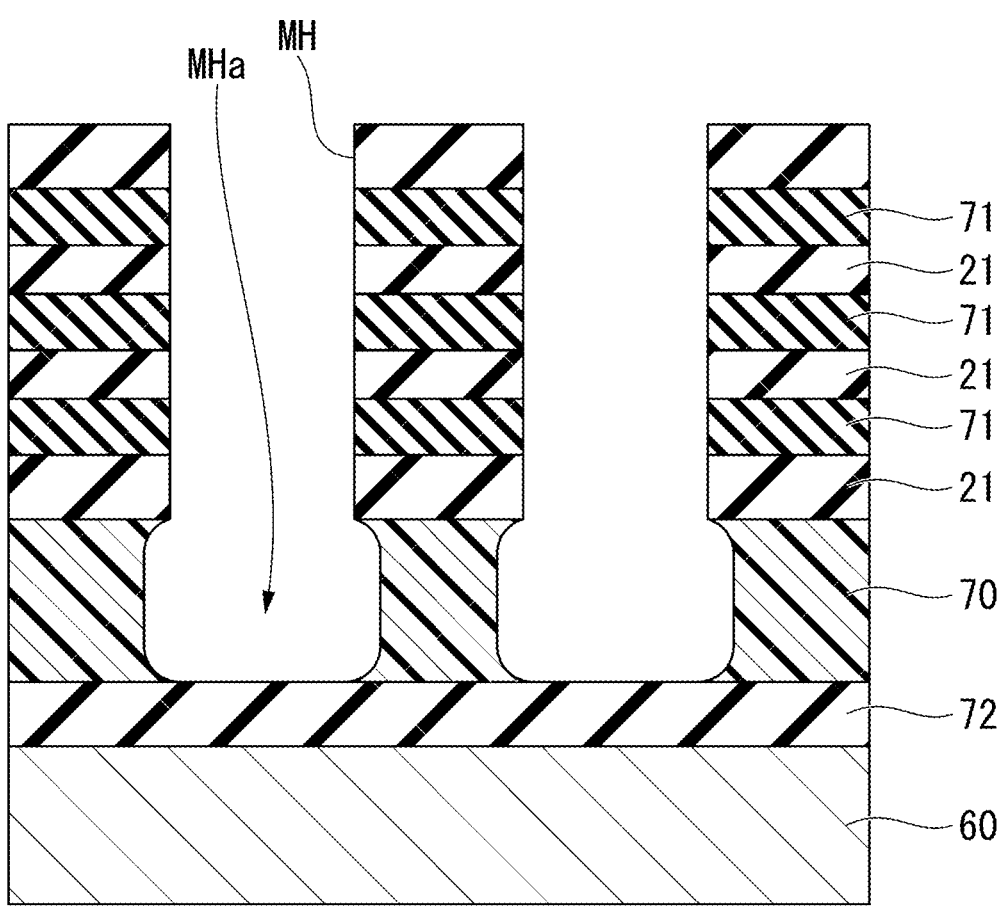
FIG. 19 is a cross-sectional view illustrating the method of manufacturing the semiconductor storage device according to the second embodiment.
Figure 19:
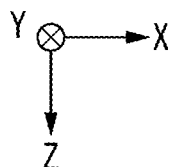

Next, as illustrated in FIG. 19, a portion of the memory hole MH corresponding to the intermediate layer 70 is further removed to expand a space in a bottom portion MHa of the memory hole MH. The inner peripheral length of the bottom portion MHa of the memory hole MH is greater than the inner peripheral length of the memory hole MH in the stack 20.

Figure 20:
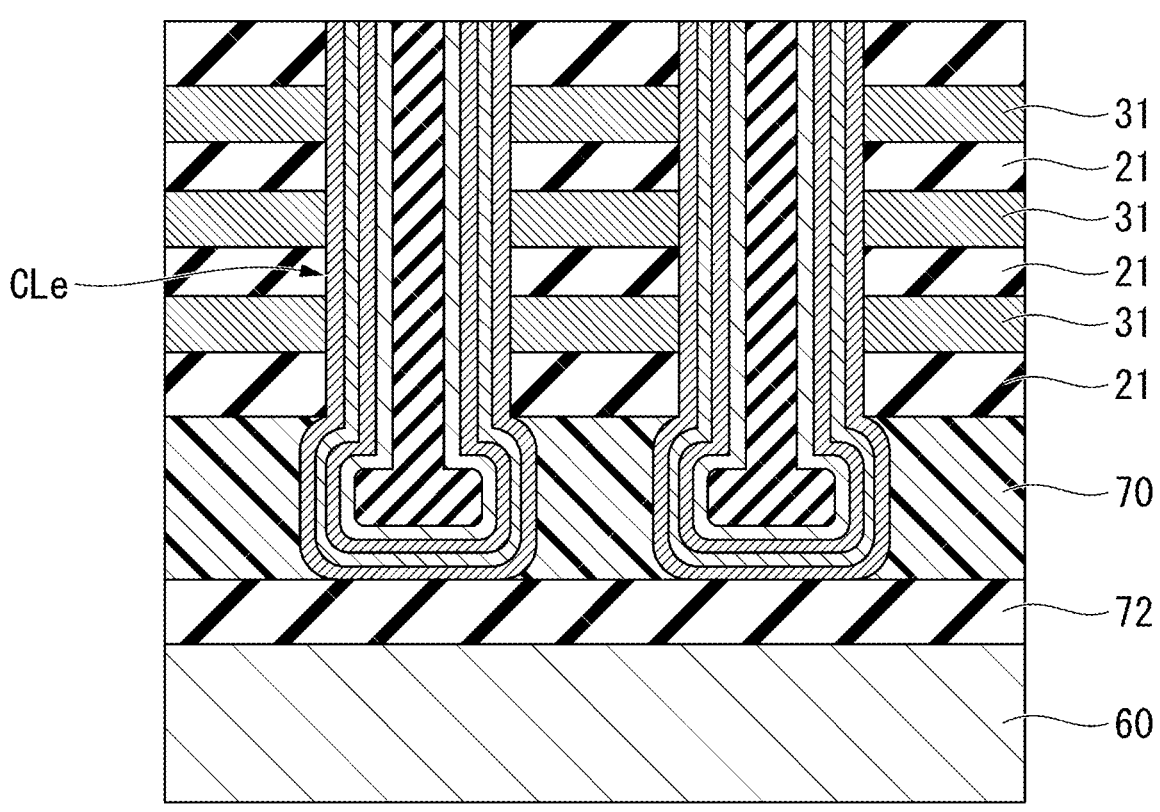
FIG. 20 is a cross-sectional view illustrating the method of manufacturing the semiconductor storage device according to the second embodiment.
Figure 20:
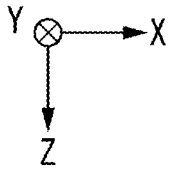

Next, as illustrated in FIG. 20, the memory stacked film 42, the semiconductor channel 41, and the insulating core 40 are formed in this order within the memory hole MH to form the columnar body CLe. Since the inner peripheral length of the bottom portion MHa of the memory hole MH is greater than the inner peripheral length of the memory hole MH in the stack 20, the semiconductor channel 41A is formed along the inner wall of the bottom portion MHa rather than filling up the bottom portion MHa.

Similarly to the first embodiment, the sacrificial layer 71 is replaced with the first conductive layer 31 by a replacement treatment after the columnar body CLe is formed (replacement step). In addition, the stack 20 may be formed by alternately stacking the plurality of insulating layers 21 and the plurality of first conductive layers 31 on the substrate 60 without performing the replacement step of the first conductive layer 31.

Figure 21:
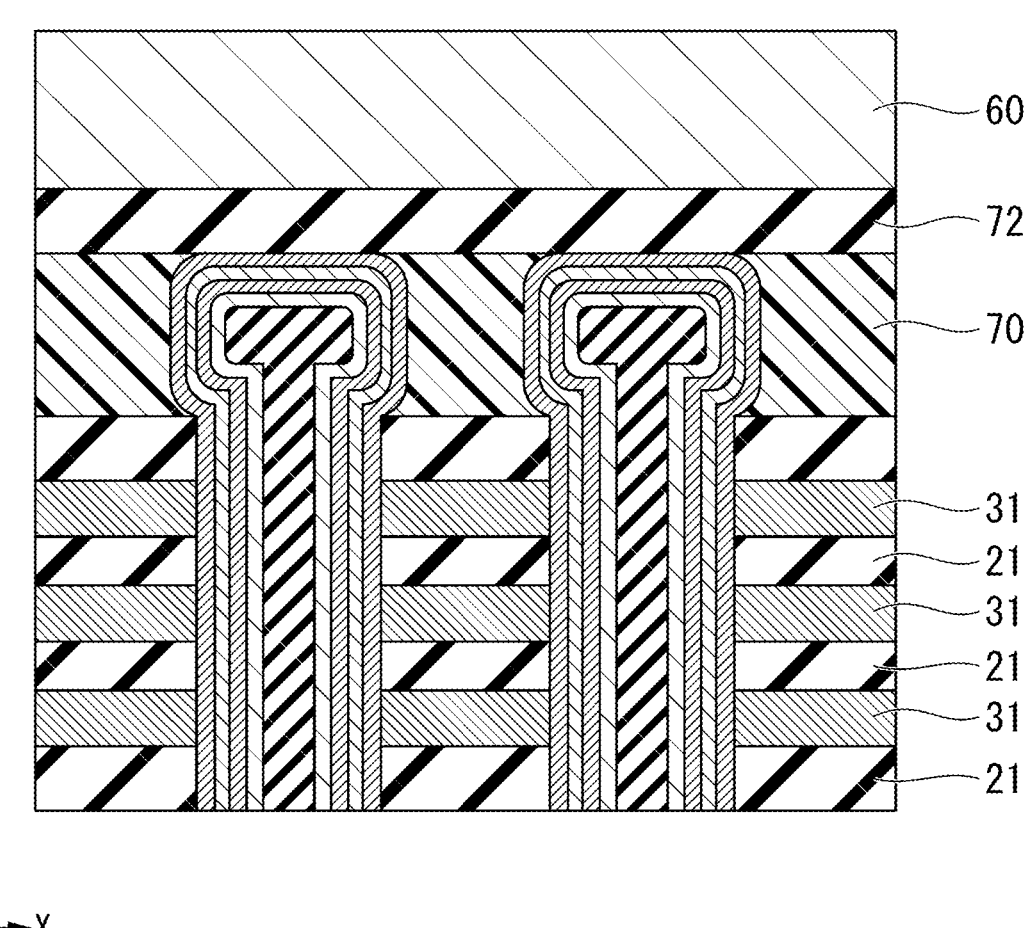
FIG. 21 is a cross-sectional view illustrating the method of manufacturing the semiconductor storage device according to the second embodiment.

After the columnar body CLe is formed, the insulating layer 22, the columnar contacts CV, V1 and V2, the conductive layer 32 (bit line BL), and the first pad 36 are formed above the columnar body CLe (see, for example, FIG. 4), and the memory chip MC is produced. The produced memory chip MC is inverted, as illustrated in FIG. 21, and is bonded to the circuit chip CC, similarly to the first embodiment.

Figure 22:
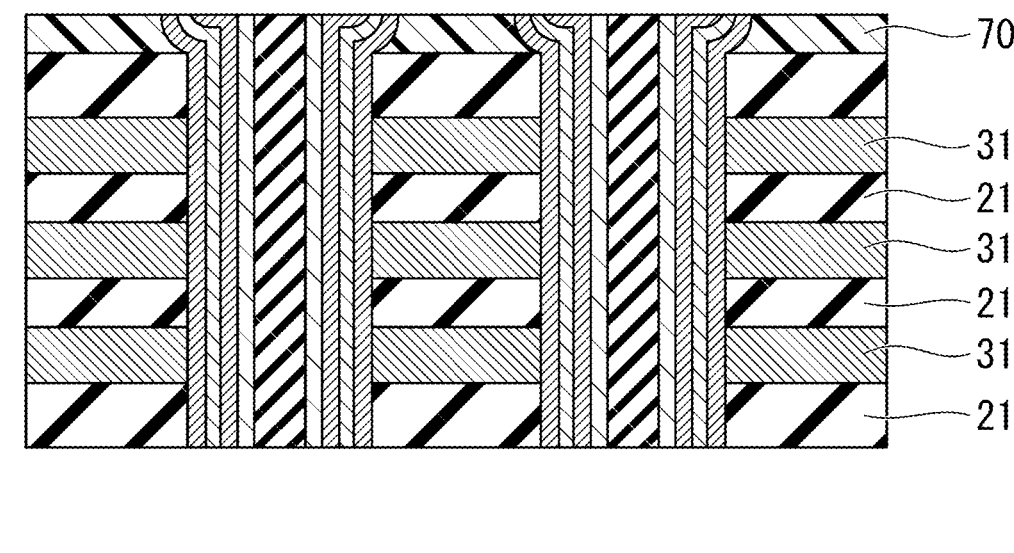
FIG. 22 is a cross-sectional view illustrating the method of manufacturing the semiconductor storage device according to the second embodiment.

Next, as illustrated in FIG. 22, the substrate 60 and a part of the intermediate layer 70 are removed until the semiconductor channel 41A is exposed. By removing the substrate 60 and a part of the intermediate layer 70, the surface of each layer constituting the columnar body CLe is exposed.

Figure 23:
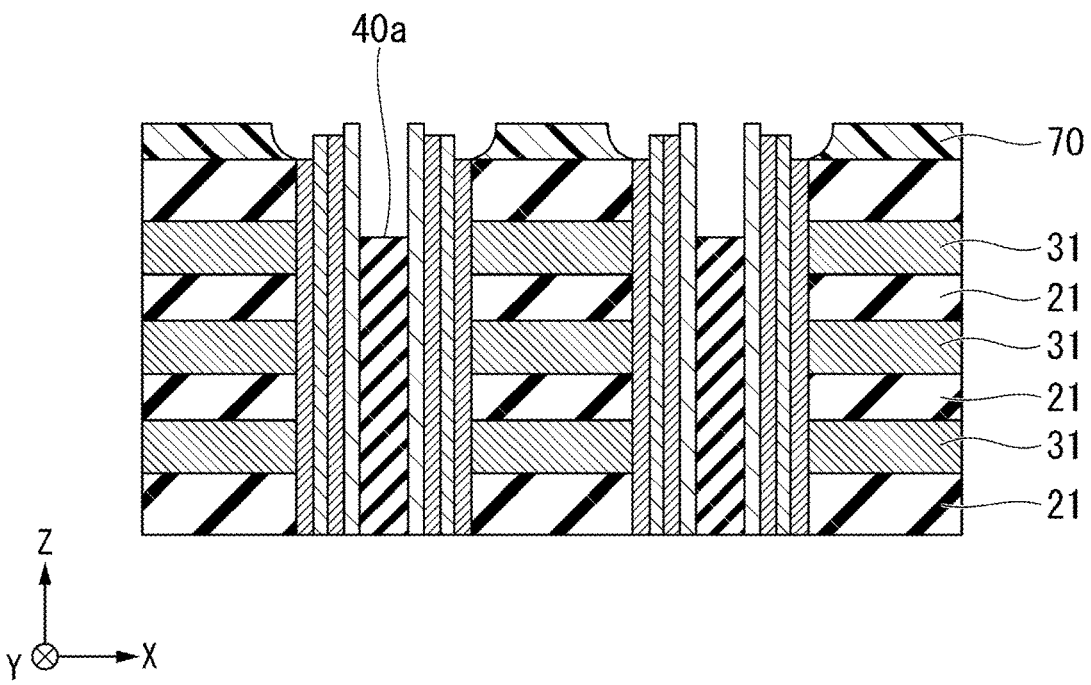
FIG. 23 is a cross-sectional view illustrating the method of manufacturing the semiconductor storage device according to the second embodiment.

Next, as illustrated in FIG. 23, the upper surface of the columnar body CLe is etched so that the exposed surface of the insulating core 40 is at a position lower than the upper surface 20A of the stack 20. Specifically, the insulating core 40 which is a silicon oxide is selectively etched using the intermediate layer 70 as a mask. The etching of the upper surface of the columnar body CLe may be performed using an etchant by which the etching rate of the insulating core 40 is higher than that of the charge storage film 44. In addition, the upper surface 40a of the insulating core 40 may be at a position where it overlaps with the uppermost first conductive layer 31 of the stack 20 in the Z direction.

After the above etching, the intermediate layer 70 functioning as a mask may be removed so that a part thereof remains, similarly to the first embodiment. Alternatively, the entirety of the intermediate layer 70 may be removed.

Figure 24:
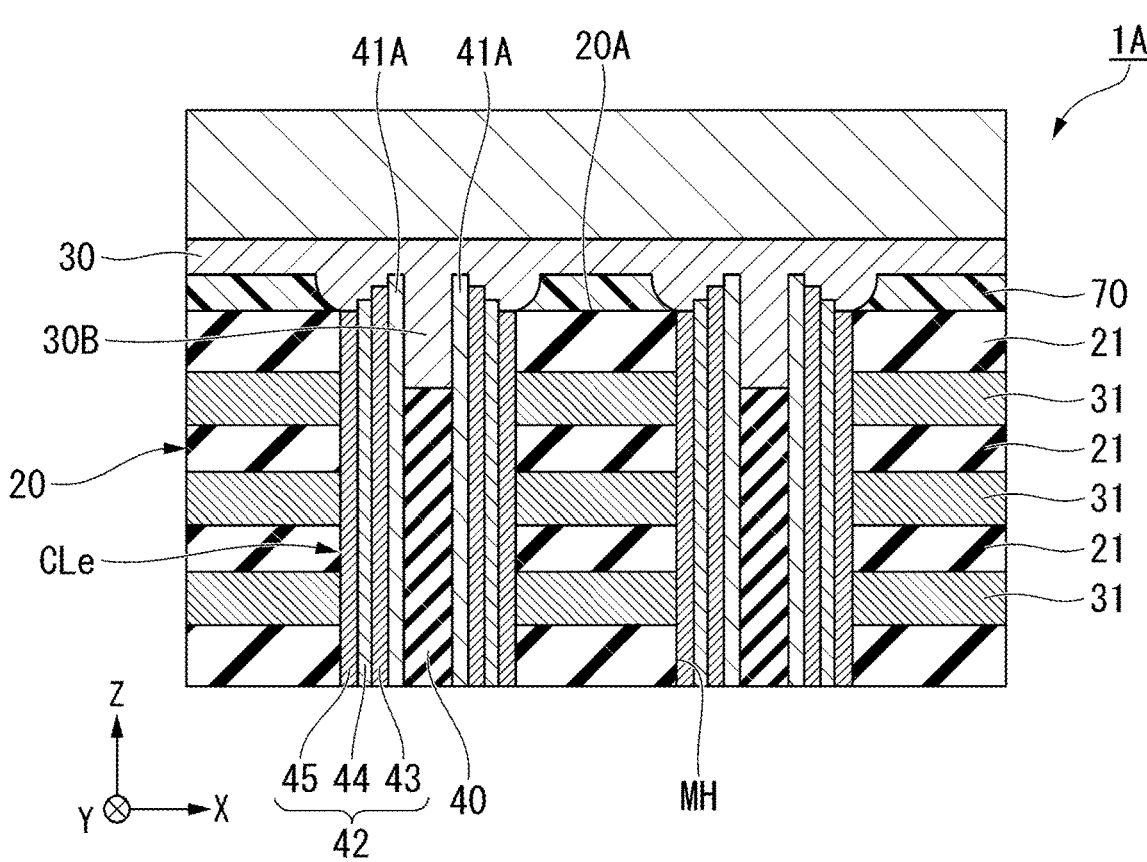
FIG. 24 is a cross-sectional view illustrating the method of manufacturing the semiconductor storage device according to the second embodiment.

Next, the second conductive layer 30 is formed on the upper surface of the etched columnar body CLe and the upper surface 20A of the stack 20, whereby the semiconductor storage device 1A illustrated in FIG. 24 is manufactured. The second conductive layer 30 functions as a part of the source line SL. Further, similarly to the first embodiment, the conductor layer 37 may further be provided above the second conductive layer 30.

As described above, the structure is formed in which at least a part of the interface between the second conductive layer 30 and the semiconductor channel 41A is located lower than the upper surface 20A of the stack 20. In addition, the manufacturing steps described above are only an example. Other steps may be inserted between the respective manufacturing steps.

In the semiconductor storage device 1A of the second embodiment, the interface between the protrusion 30B of the second conductive layer 30 and the semiconductor channel 41A is located lower than the upper surface of the stack 20. Thus, it is possible to appropriately apply a voltage to a barrier portion for electrons flowing into the semiconductor channel 41A (the interface between a metal and a semiconductor), which may prevent deterioration of cell current.

Further, in the semiconductor storage device 1A of the second embodiment, at least a part of the interface between the protrusion 30B and the semiconductor channel 41A may be at the same position as the uppermost first conductive layer 31 of the stack 20 in the Z direction. Thus, the interface between the second conductive layer 30 and the semiconductor channel 41A makes it easier to apply a voltage, and an erase operation may also be stabilized.

Further, in the semiconductor storage device 1A of the second embodiment, the side surface 30Ba of the protrusion 30B of the second conductive layer 30 may be in contact with the inner peripheral surface of the semiconductor channel 41A. That is, a structure may be formed in which the protrusion 30B of the second conductive layer 30 and the inner peripheral surface of the semiconductor channel 41A are electrically connected. Thus, the area of the contact surface between the second conductive layer 30 and the semiconductor channel 41A may be sufficiently secured, which may avoid a contact failure.

Further, each of the first to fourth modifications in the first embodiment may also be applied in the second embodiment. In this case, the same effect as the second embodiment may also be exhibited.

For example, similarly to the third modification of the first embodiment, the second embodiment may also have a structure in which a silicide layer is formed at the connection portion between the semiconductor channel and the second conductive layer and at the interface between the stack 20 and the second conductive layer 30. Hereinafter, an example (modification) in which a silicide layer is formed in the second embodiment will be described with reference to FIG. 25.

Figure 25:
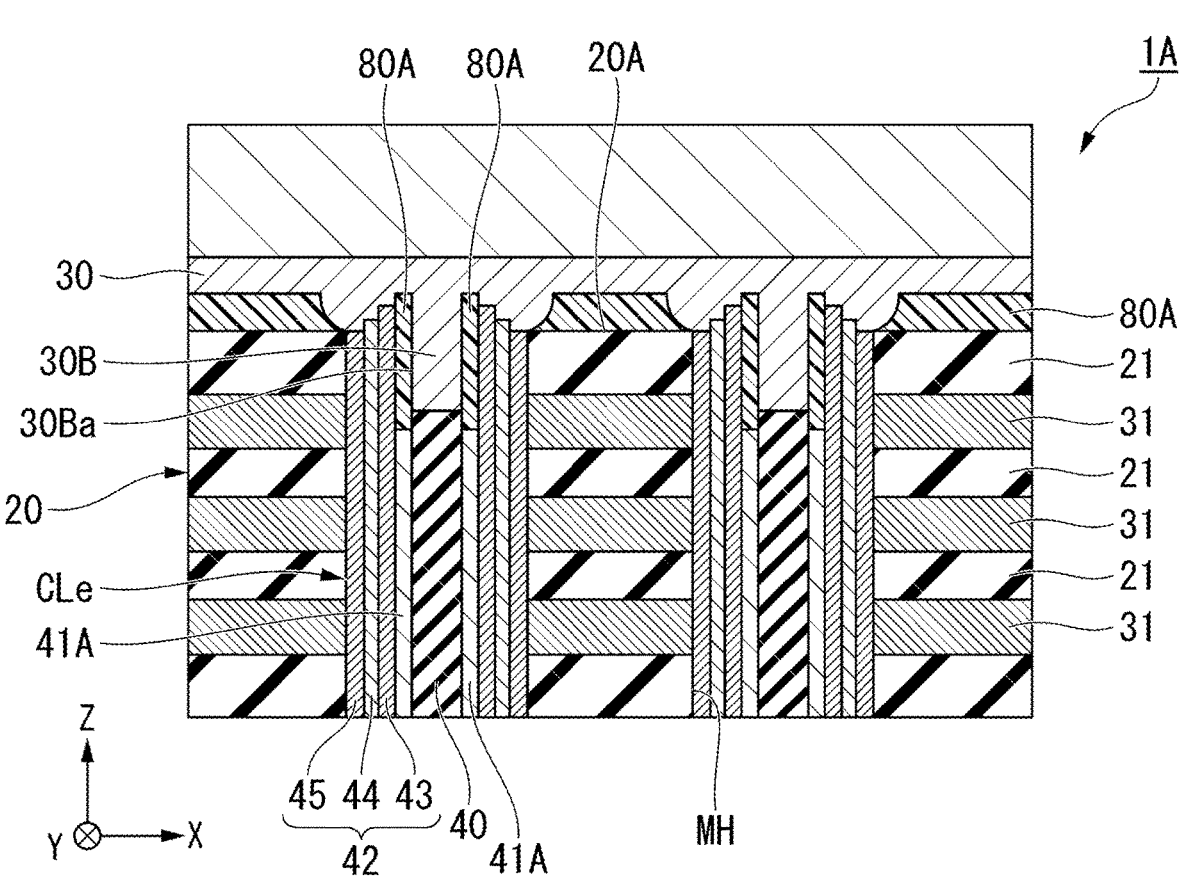
FIG. 25 is a cross-sectional view illustrating a part of the semiconductor storage device according to a modification of the second embodiment.

FIG. 25 is a cross-sectional view illustrating a part of a columnar body CLf of the semiconductor storage device 1A according to a modification of the second embodiment. The semiconductor storage device 1A of the third modification has the same configuration as that of the semiconductor storage device 1 of the first embodiment except for a configuration described below.

The semiconductor storage device 1A of this modification may have a structure in which a silicide layer 80A is formed between the outer peripheral surface of the protrusion 30B of the second conductive layer 30 and the tunnel insulating film 43 and at the interface between the stack 20 and the second conductive layer 30. The silicide layer 80A between the outer peripheral surface of the protrusion 30B and the tunnel insulating film 43 is a portion in which an upper portion of the semiconductor channel 41A is silicided. That is, the silicide layer 80A located at the upper portion of the semiconductor channel 41A is at a position where it overlaps with the semiconductor channel 41A when viewed from the Z direction. Meanwhile, the silicide layer 80A located at the interface between the stack 20 and the second conductive layer 30 is a portion in which the intermediate layer 70 made of polysilicon is silicided when the intermediate layer 70 remains in the manufacturing process. That is, when the entirety of the intermediate layer 70 is removed in the manufacturing process, the silicide layer 80A located at the interface between the stack 20 and the second conductive layer 30 as illustrated in FIG. 25 is omitted. Further, when a silicon carbonitride (SiCN), a silicon carbide (SiC), or a high-k material (high dielectric constant material) is used as the intermediate layer 70 (see, for example, FIG. 6B), the silicide layer 80A is formed only at the upper portion of the semiconductor channel 41A. As for a metal used for the silicide layer 80A, for example, nickel may be used.

In the manufacturing method of this modification, the same method as that of the third modification of the first embodiment may also be employed.

Similarly to the first embodiment, the configuration according to this modification may also prevent deterioration of cell current of the semiconductor storage device 1.

Although several embodiments have been described above, the embodiments are not limited to the above examples. For example, the memory film may be a ferroelectric film provided in a Ferroelectric FET (FeFET) memory that stores data according to the direction of polarization. The ferroelectric film is formed of, for example, a hafnium oxide.

According to at least one embodiment described above, a wiring layer has a protrusion protruding from the upper surface of a stack toward the upper surface of a columnar body at a position where it overlaps with a semiconductor body when viewed in the Z direction, and the interface between the protrusion and a semiconductor channel is located lower than the upper surface of the stack, whereby deterioration of cell current of a semiconductor storage device may be prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a stack including a plurality of first conductive layers and a plurality of insulating layers, the plurality of first conductive layers and the plurality of insulating layers being alternately stacked one by one in a first direction;
a columnar body extending in the first direction in the stack; and
a second conductive layer connected to the columnar body,
wherein the columnar body includes an insulating core, a memory film provided between the plurality of first conductive layers and the insulating core, and a first semiconductor channel provided between the insulating core and the memory film,

wherein an upper surface of the insulating core is located lower than an upper end of the columnar body in the first direction,
wherein the second conductive layer has a main body portion and a protrusion, the protrusion protruding from the main body portion toward the upper surface of the insulating core, the protrusion extending in the first direction inside the columnar body, and
wherein the protrusion is in contact with the first semiconductor channel on a bottom surface or a side surface of the protrusion, the first semiconductor channel includes a first portion with a first width, a second portion with a second width, and a third portion with a third width, the first portion of the first semiconductor channel disposed between the insulating core and the plurality of first conductive layers, the second portion of the first semiconductor channel connected to the protrusion of the second conductive layer, the third portion disposed between the first portion and the second portion in the first direction, the first width narrower than the second width and the third width wider than the second width.

2. The semiconductor storage device according to claim 1, wherein at least a part of an interface between the protrusion and the first semiconductor channel is at the same position as a position of an uppermost first conductive layer among the plurality of first conductive layers provided in the stack in the first direction.

3. The semiconductor storage device according to claim 1, wherein the first semiconductor channel covers the upper surface of the insulating core, and
wherein an upper surface of the first semiconductor channel is in contact with the bottom surface of the protrusion.

4. The semiconductor storage device according to claim 1, further comprising: an intermediate layer disposed between the second conductive layer and the stack,
wherein the protrusion protrudes downward relative to a lower surface of the intermediate layer.

5. The semiconductor storage device according to claim 4, wherein the intermediate layer contains at least one of polysilicon, silicon carbonitride, silicon carbide, a high dielectric constant material, or aluminum oxide.

6. The semiconductor storage device according to claim 1, comprising:
a first chip, the first chip including the stack, the columnar body, and a first pad; and
a second chip, the second chip including a transistor and a second pad provided above the transistor,
wherein the first chip and the second chip are bonded by the first pad and the second pad.

7. The semiconductor storage device according to claim 1, wherein a part of the memory film extends upward from an upper surface of the stack.

8. The semiconductor storage device according to claim 1, wherein the columnar body has a first columnar portion and a second columnar portion, the second columnar portion connected to the first columnar portion in the first direction in the stack, and
wherein an outer peripheral length of the second columnar portion is shorter than an outer peripheral length of the first columnar portion.

9. The semiconductor storage device according to claim 1, wherein a first portion of the second conductive layer is in contact with the first semiconductor channel, and the first portion is silicided.

10. The semiconductor storage device according to claim 1, wherein the second conductive layer contains one or more selected from a group consisting of Ti, TiN, Ni, NiSi, and P-doped Si.

11. The semiconductor storage device according to claim 1, wherein the semiconductor storage device includes a NAND memory.

12. The semiconductor storage device according to claim 1, wherein at least some of the first conductive layers function as word lines.

13. The semiconductor storage device according to claim 1, wherein the first conductive layers contain at least one of tungsten or polycrystalline silicon.

14. The semiconductor storage device according to claim 1, wherein the insulating core contains silicon oxide.

15. The semiconductor storage device according to claim 1, wherein the plurality of insulating layers contains silicon oxide.

16. The semiconductor storage device according to claim 1, further comprising:

a second semiconductor channel disposed opposite the insulating core from the first semiconductor channel in a second direction crossing the first direction and extending in the first direction.

17. The semiconductor storage device according to claim 1, wherein the third portion of the first semiconductor channel is laterally aligned with one of the plurality of insulating layers closest to the second conductive layer.

\* \* \* \* \*